US009449952B2

(12) United States Patent
Atkinson et al.

(10) Patent No.: US 9,449,952 B2
(45) Date of Patent: *Sep. 20, 2016

(54) ACCESSING OR INTERCONNECTING INTEGRATED CIRCUITS

(71) Applicant: CrossFire Technologies, Inc., Eden Prairie, MN (US)

(72) Inventors: Kevin Atkinson, Chanhassen, MN (US); Clifford H. Boler, Eden Prairie, MN (US)

(73) Assignee: CrossFire Technologies, Inc., Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/623,165

(22) Filed: Feb. 16, 2015

(65) Prior Publication Data

US 2015/0228626 A1 Aug. 13, 2015

Related U.S. Application Data

(60) Continuation of application No. 14/060,057, filed on Oct. 22, 2013, now Pat. No. 8,958,227, which is a continuation of application No. 13/351,142, filed on Jan. 16, 2012, now Pat. No. 8,569,879, which is a (Continued)

(51) Int. Cl.
*G11C 5/02* (2006.01)
*G11C 5/06* (2006.01)
(Continued)

(52) U.S. Cl.
CPC ........... *H01L 25/0657* (2013.01); *H01L 23/50* (2013.01); *H01L 23/528* (2013.01);
(Continued)

(58) Field of Classification Search
CPC .......... G11C 5/02; G11C 5/025; G11C 5/06; G11C 7/1069; G11C 7/10; G11C 11/4096
USPC .................. 365/51, 63, 164, 189.17, 209
See application file for complete search history.

(56) References Cited

U.S. PATENT DOCUMENTS

| 6,110,806 A | 8/2000 | Pogge |
| 7,005,322 B2 | 2/2006 | Teysseyre |

(Continued)

FOREIGN PATENT DOCUMENTS

| CN | 1477688 A | 2/2004 |
| DE | 10130864 A1 | 1/2003 |

(Continued)

OTHER PUBLICATIONS

"U.S. Appl. No. 12/612,256, Notice of Allowance mailed Sep. 14, 2011", 10 pgs.

(Continued)

*Primary Examiner* — Ly D Pham
(74) *Attorney, Agent, or Firm* — Schwegman Lundberg & Woessner, P.A.

(57) ABSTRACT

Multiple integrated circuits (ICs) die, from different wafers, can be picked-and-placed, front-side planarized using a vacuum applied to a planarizing disk, and attached to each other or a substrate. The streets between the IC die can be filled, and certain techniques or fixtures allow application of monolithic semiconductor wafer processing for interconnecting different die. High density I/O connections between different IC die can be obtained using structures and techniques for aligning vias to I/O structures, and programmably routing IC I/O lines to appropriate vias. Existing IC die can be retrofitted for such interconnection to other IC die, such as by using similar techniques or tools.

20 Claims, 20 Drawing Sheets

Related U.S. Application Data division of application No. 12/612,256, filed on Nov. 4, 2009, now Pat. No. 8,097,526, which is a continuation-in-part of application No. PCT/US2008/062163, filed on May 1, 2008.

(60) Provisional application No. 60/927,607, filed on May 4, 2007.

(51) Int. Cl.

| | | |
|---|---|---|
| *G11C 7/00* | (2006.01) | |
| *G11C 5/04* | (2006.01) | |
| *G11C 7/10* | (2006.01) | |
| *H01L 25/065* | (2006.01) | |
| *H01L 23/538* | (2006.01) | |
| *H03K 19/0175* | (2006.01) | |
| *H01L 23/00* | (2006.01) | |
| *H01L 23/50* | (2006.01) | |
| *H01L 23/522* | (2006.01) | |
| *H01L 23/528* | (2006.01) | |
| *G11C 11/4096* | (2006.01) | |
| *H01L 21/683* | (2006.01) | |
| *H01L 21/56* | (2006.01) | |

(52) U.S. Cl.
CPC ....... *H01L23/5226* (2013.01); *H01L 23/5382* (2013.01); *H01L 23/5389* (2013.01); *H01L 24/14* (2013.01); *H01L 24/19* (2013.01); *H03K 19/017581* (2013.01); *G11C 5/02* (2013.01); *G11C 5/025* (2013.01); *G11C 5/06* (2013.01); *G11C 7/10* (2013.01); *G11C 7/1069* (2013.01); *G11C 11/4096* (2013.01); *H01L 21/568* (2013.01); *H01L 21/6835* (2013.01); *H01L 2224/04105* (2013.01); *H01L 2224/16113* (2013.01); *H01L 2224/16145* (2013.01); *H01L 2224/24137* (2013.01); *H01L 2225/06513* (2013.01); *H01L 2225/06548* (2013.01); *H01L 2924/0002* (2013.01); *H01L 2924/14* (2013.01)

(56) References Cited

U.S. PATENT DOCUMENTS

| | | |
|---|---|---|
| 7,074,696 B1 | 7/2006 | Frankowsky |
| 7,569,421 B2 | 8/2009 | Do et al. |
| 8,097,526 B2 | 1/2012 | Atkinson et al. |
| 8,569,879 B2 | 10/2013 | Atkinson et al. |
| 8,958,227 B2* | 2/2015 | Atkinson ............ H01L 23/5389 257/209 |
| 2006/0278972 A1 | 12/2006 | Bauer et al. |
| 2007/0090534 A1 | 4/2007 | Iwasaki et al. |
| 2007/0096263 A1 | 5/2007 | Furukawa et al. |
| 2008/0150155 A1 | 6/2008 | Periaman et al. |
| 2009/0278244 A1 | 11/2009 | Dunne et al. |
| 2010/0140784 A1 | 6/2010 | Atkinson et al. |
| 2012/0112245 A1 | 5/2012 | Atkinson et al. |
| 2014/0151752 A1 | 6/2014 | Atkinson et al. |

FOREIGN PATENT DOCUMENTS

| | | |
|---|---|---|
| DE | 10234951 A1 | 2/2004 |
| DE | 102006001429 A1 | 3/2007 |
| TW | 447025 B | 7/2001 |
| TW | 200414495 A | 8/2004 |
| TW | 200639949 A | 11/2006 |
| WO | WO-2004057662 A2 | 7/2004 |
| WO | WO-2006105586 A1 | 10/2006 |
| WO | WO-2008137511 A1 | 11/2008 |

OTHER PUBLICATIONS

"U.S. Appl. No. 12/612,256, Response filed Jun. 23, 2011 to Restriction Requirement mailed Mar. 23, 2011", 10 pgs.

"U.S. Appl. No. 12/612,256, Restriction Requirement mailed Mar. 23, 2011", 6 pgs.

"U.S. Appl. No. 13/351,142, Notice of Allowance mailed Jul. 1, 2013", 12 pgs.

"U.S. Appl. No. 14/060,057, Notice of Allowance mailed Oct. 10, 2014", 9 pgs.

"International Application Serial No. PCT/US2008/062163, Demand for Preliminary Examination and Response to Written Opinion mailed Mar. 4, 2009", 15 pgs.

"International Application Serial No. PCT/US2008/062163, International Preliminary Report on Patentability mailed Aug. 26, 2009", 12 pgs.

"International Application Serial No. PCT/US2008/062163, Search Report mailed Jul. 30, 2008", 6 pgs.

"International Application Serial No. PCT/US2008/062163, Written Opinion mailed Jul. 30, 2008", 6 pgs.

"Taiwanese Application Serial No. 097116354 Reponse filed Nov. 25, 2014 to Non Final Office Action mailed Aug. 26, 2014", 23 Pages.

"Taiwanese Application Serial No. 097116354, Office Action mailed Apr. 8, 2014", (w/ English Translation), 9 pgs.

"Taiwanese Application Serial No. 097116354, Office Action mailed Aug. 26, 2014", 7 pgs.

"Taiwanese Application Serial No. 097116354, Response filed Jul. 7, 2014 to Office Action mailed Apr. 8, 2014", (w/ English Translation of Amended Claims), 39 pgs.

\* cited by examiner

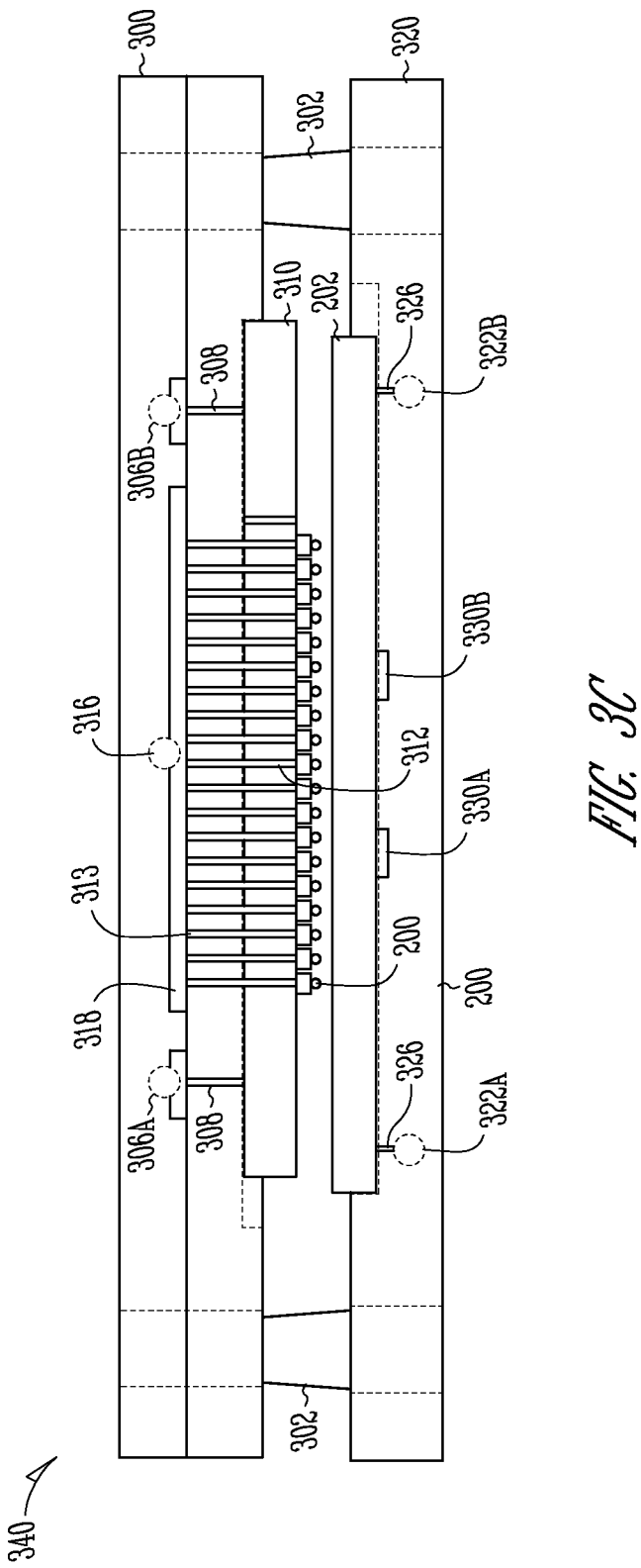

FIG. 5A

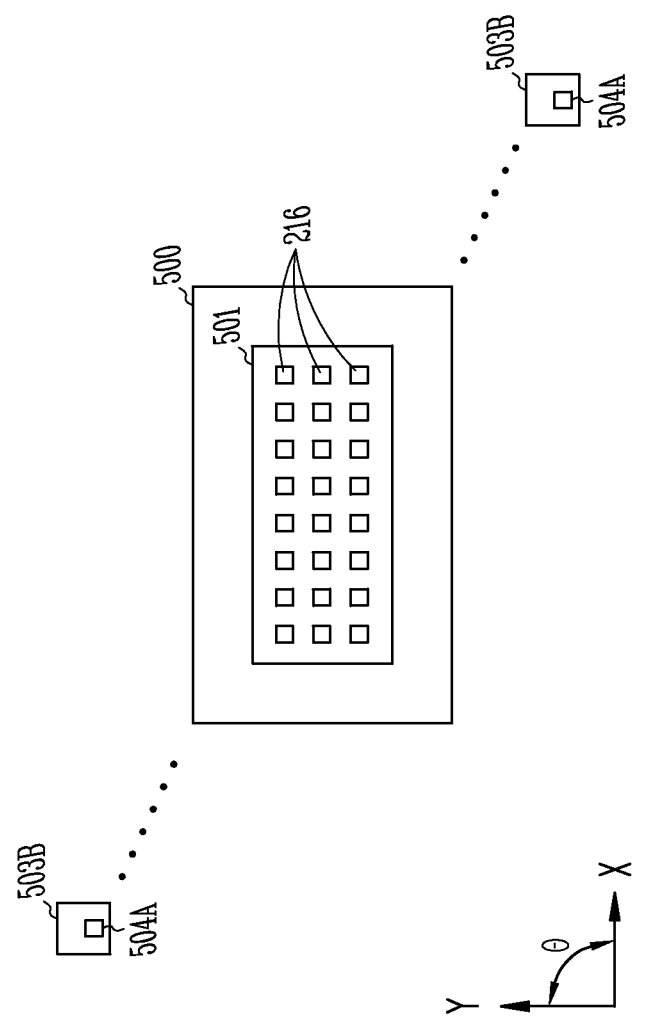

FIG. 7

| | 502AB/502AC | 502AD/502AE | 502AF/502AG | 502AH/502AI | 502AJ/502AK | 502AL/502AM | 502AN/502AO | 502AP/502AQ | 502AR/502AS | 502AT/502AU |
|---|---|---|---|---|---|---|---|---|---|---|
| 502AA | 1, 1 | 2, 2 | 3, 3 | 4, 4 | 3, 3 | 4, 4 | 3, 3 | 2, 2 | 2, 2 | 1, 1 |
| 502BA | 1, 1 | 2, 2 | 3, 3 | 4, 4 | 3, 3 | 4, 4 | 3, 3 | 2, 2 | 2, 2 | 1, 1 |
| 502CA | 2, 2 | 4, 4 | 6, 6 | 8, 8 | 6, 6 | 8, 8 | 6, 6 | 4, 4 | 4, 4 | 2, 2 |
| 502DA | 2, 2 | 4, 4 | 6, 6 | 8, 8 | 6, 6 | 8, 8 | 6, 6 | 4, 4 | 4, 4 | 2, 2 |
| 502EA | 3, 3 | 6, 6 | 9, 9 | 12, 12 | 9, 9 | 12, 12 | 9, 9 | 6, 6 | 6, 6 | 3, 3 |
| 502FA | 3, 3 | 6, 6 | 9, 9 | 12, 12 | 9, 9 | 12, 12 | 9, 9 | 6, 6 | 6, 6 | 3, 3 |
| 502GA | 3, 3 | 6, 6 | 9, 9 | 12, 12 | 9, 9 | 12, 12 | 9, 9 | 6, 6 | 6, 6 | 3, 3 |
| 502HA | 2, 2 | 4, 4 | 6, 6 | 8, 8 | 6, 6 | 8, 8 | 6, 6 | 4, 4 | 4, 4 | 2, 2 |
| 502IA | 2, 2 | 4, 4 | 6, 6 | 8, 8 | 6, 6 | 8, 8 | 6, 6 | 4, 4 | 4, 4 | 2, 2 |
| 502JA | 1, 1 | 2, 2 | 3, 3 | 4, 4 | 3, 3 | 4, 4 | 3, 3 | 2, 2 | 2, 2 | 1, 1 |
| 502KA | 1, 1 | 2, 2 | 3, 3 | 4, 4 | 3, 3 | 4, 4 | 3, 3 | 2, 2 | 2, 2 | 1, 1 |

US 9,449,952 B2

ACCESSING OR INTERCONNECTING INTEGRATED CIRCUITS

CLAIM OF PRIORITY

This application is a continuation of U.S. patent application Ser. No. 14/060,057 which was filed on Oct. 22, 2013, which is a continuation of U.S. patent application Ser. No. 13/351,142, which was filed on Jan. 16, 2012, which is a divisional of U.S. patent application Ser. No. 12/612,256, which was filed on Nov. 4, 2009, which is a continuation-in-part of PCT/US2008/062163, which was filed on May 1, 2008, which claims priority to U.S. provisional application 60/927,607, which was filed on May 4, 2007, the benefit of priority of each of which is claimed herein, and each of which is incorporated herein by reference.

TECHNICAL FIELD

This patent document pertains generally to semiconductor integrated circuits and assemblies, and more particularly, but not by way of limitation, to systems and methods related to accessing or combining one or more integrated circuits.

BACKGROUND

As integrated circuits (ICs) become more complex, their usefulness may be limited by the number of inputs or outputs (I/O) provided by the IC. Such inputs or outputs may be needed to interconnect a particular IC to one or more other integrated circuits, such as to build a multiple IC system. IC inputs or outputs typically involve use of bonding pads to which respective wires or other connectors are bonded. Such I/O pads are typically located on a top surface of the IC, and are usually distributed about the rectangular periphery of the IC.

OVERVIEW

The present inventors have recognized that one approach to increasing the I/O capability of an IC would be to redistribute the I/O pads away from the periphery of the IC, such as toward the center of the IC. However, using conventional semiconductor processing techniques, the resulting I/O pad density would still be limited by the relatively large size of the I/O pads. For example, an I/O pad is typically sized larger than a minimum-sized via opening in an insulator overlying the I/O pad. This is because the conductive pad material is typically used as an etch-stop to stop the insulator etching process that forms the via in the insulator and over the pad. Therefore, the pad is typically made larger than the via to allow for misalignment during manufacture. The present inventors have recognized an unmet need for improved approaches for increasing I/O capability of an IC, as well as for integrating multiple ICs.

This document describes, among other things, how multiple integrated circuits (ICs) die, from different wafers, can be picked-and-placed, front-side planarized using a vacuum applied to a planarizing disk, and attached to a substrate. The "streets" between the IC die can be filled, and certain techniques or fixtures allow application of monolithic semiconductor wafer processing for interconnecting different die. High density I/O connections between different IC die can be obtained using structures and techniques for aligning vias to I/O structures, and programmably routing IC I/O lines to appropriate vias. Existing IC die can be retrofitted for such interconnection to other IC die, such as by using similar techniques or tools.

This overview is intended to provide an overview of the subject matter of the present patent application. It is not intended to provide an exclusive or exhaustive explanation of the invention. The detailed description is included to provide further information about the subject matter of the present patent application.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 3C shows an example of portions of the fixture for planarizing multiple IC die, including showing examples of the upper and lower stages together.

FIG. 5A is an illustrative but non-limiting example of a three by eight (3×8) x-y grid array of twenty-four 8 µm by 8 µm vias shown overlaying an x-y grid array of underlying 2 µm by 2 µm I/O structures.

FIG. 5C illustrates inclusion of an alignment target structure and an alignment via.

FIG. 7 is a spatial representation, for the example of FIGS. 5A and 5B, of how many routing inputs are needed for each cell, which depends on how many vias may potentially align with a particular cell.

DETAILED DESCRIPTION

The following detailed description includes references to the accompanying drawings, which form a part of the detailed description. The drawings show, by way of illustration, specific embodiments in which the invention may be practiced. These embodiments are also referred to herein as "examples." The embodiments may be combined in various permutations or combinations, other embodiments may be used, or structural, logical and electrical changes may be made without departing from the scope of the present invention. The following detailed description is, therefore, not to be taken in a limiting sense, and the scope of the present invention is defined by the appended claims and any equivalents to which such claims are legally entitled.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

This document describes, among other things, a process for interconnecting multiple ICs, as well as certain new and useful devices. The present inventors have recognized that the process of interconnecting multiple ICs can take advantage of certain aspects of high density semiconductor processing techniques that were previously limited to use with a single monolithic semiconductor wafer. As discussed below, the present inventors have, among other things, overcome certain obstacles to applying monolithic semiconductor wafer processing techniques to multiple diced ICs—that need not come from the same monolithic semiconductor wafer.

Some Processing and Other Examples

Figure 1:
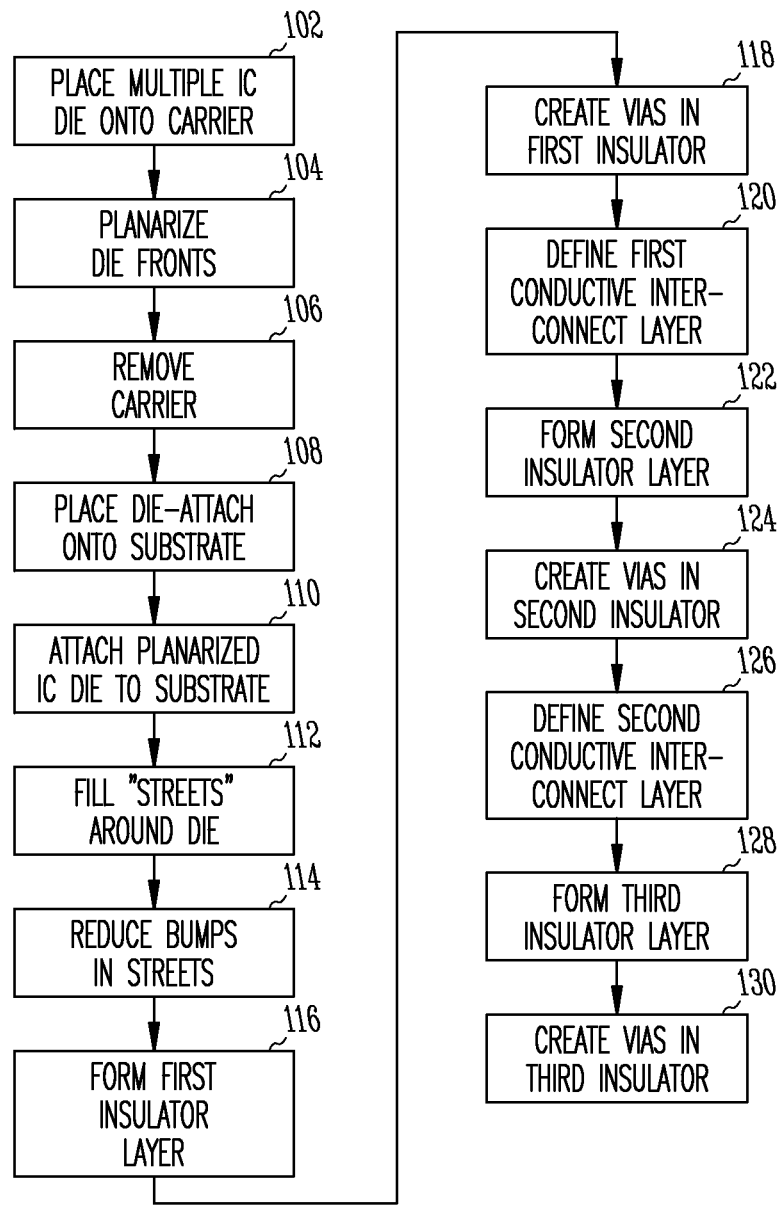
FIG. 1 illustrates generally an example of certain aspects of a method for interconnecting multiple IC die.

FIG. 1 illustrates generally an example of certain aspects of a method for interconnecting multiple IC die. At 102, multiple IC die are placed onto a carrier. In certain examples, the carrier includes a portion of adhesive tape, for example, having one side of the tape that is adhesive, and the other side of the tape being non-adhesive. In certain examples, an arrangement of IC die are placed onto the carrier, such as onto the adhesive side of the tape. The back or bottom side of each IC die (e.g., "die backs") temporarily adheres to the tape. The die backs usually do not have the IC circuitry. Instead, the IC circuitry are typically formed on the front or top of the IC die (e.g., "die fronts") Placing the IC die on the adhesive tape can be done using a commercially-available IC die pick-and-place machine. The individual IC die need not have the identical front-to-back thickness. As an illustrative example, such a pick-and-place machine may have an accuracy of about +/−(20 to 35) μm, and can yield placement variations in x or y directions of a conceptual x-y grid on the tape, or in variations in angular orientation ("θ" variations).

At 104, the die fronts of the individual IC die are substantially planarized with respect to each other. In certain examples, this involves placing the die fronts against a planarizing flat surface. The flat surface can include through-holes, such as through which a vacuum can be applied. Applying such a vacuum will help draw the IC die fronts toward the planar surface. The vacuum can be used to hold the IC die fronts against the planar surface. This will make the die fronts of the various IC die substantially planar to each other.

In certain examples, the planarizing surface includes a semiconductor wafer through which through-holes have been created. In certain examples, the through-holes can be created using photolithography to pattern a layer of photoresist (PR) to create through-hole defining features on a semiconductor wafer at desired intervals (e.g., intervals forming a 3 mm grid, as a purely illustrative and non-limiting example). A chemical etchant (e.g., KOH) can be used to etch or otherwise create the through-holes such that they extend all the way through the semiconductor wafer. Either side of the semiconductor wafer can then be used as the planar surface for planarizing die fronts at 104. As an illustrative example, the planarizing wafer can be held in place in a fixture. A vacuum can be applied to one side of the planarizing wafer. The die fronts can be planarized against the other side of the planarizing wafer.

At 106, the adhesive tape or other carrier is removed from the die backs. For example, where the carrier is adhesive tape, the tape is peeled away from the die backs. This leaves the multiple die properly positioned (e.g., by the previous pick-and-place), with the die fronts substantially planarized to each other and vacuum-held against the planarizing surface. Because the various IC die need not be of the same thickness, the die backs need not be planar to each other— even though the die fronts are planar to each other.

At 108, a die-attachment is placed onto a substrate for carrying the multiple IC die. In certain examples, a semiconductor wafer can be used as the substrate. The positioned and front-side planarized multiple IC die can be mounted to the substrate, such as by using an adhesive die-attachment. In certain examples, placing the die-attachment onto the substrate includes placing on the substrate a desired amount of adhesive (such as Epotek H70E-4 die attachment epoxy, which has a low coefficient of thermal expansion (CTE)). In certain examples, the adhesive need only be placed at those particular locations on the substrate where the die are to be mounted. Thinner die can be mounted to the substrate using more adhesive than for the thicker die. This will accommodate the greater spacing between the die back of a thinner die and the substrate, such as when the die fronts held substantially planar to each other.

Figure 2A:
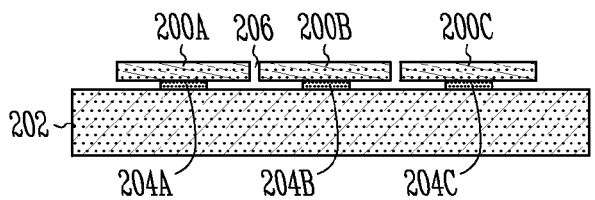
FIG. 2A shows an illustrative example of any number of multiple IC die, with substantially planarized front sides.

At 110, the positioned and front-side planarized multiple IC die are attached to the substrate, such as by using the adhesive. As an illustrative example, a fixture can be used to lower the planarizing surface toward the substrate. This will allow the die to adhere to the substrate such that the die fronts are planar to each other. One or more silicon or other spacers on the fixture can be used to control how far the planarizing surface can be lowered. This can be used to establish a desired separation distance between the planarizing surface and a top surface of the substrate. After the adhesive cures, the vacuum can be released. Then, the fixture can be used to lift the planarizing surface away from the front sides of the multiple IC. FIG. 2A shows an illustrative example of any number of multiple IC die 200A-C, with substantially planarized front sides. Their back sides are mounted to the front side of a substrate 202, such as by respective adhesive portions 204A-C, in this example. As a purely illustrative and non-limiting example of typical dimensions, the thickness of a particular one or more of the IC die 200 can be about 9 mils (1 mil=25.4 μm=1/1000 inch), the thickness of an adhesive portion 204 can be about 1 mil, and a spacing of the streets 206 between adjacent die 200 can be about 1 mil.

Figure 2B:
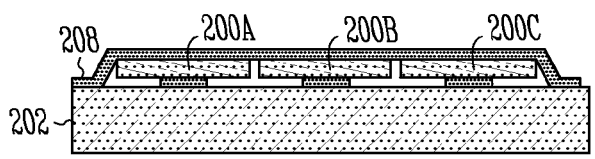
FIG. 2B shows an illustrative example of covering planarized die with a tape or other covering.
Figure 2C:
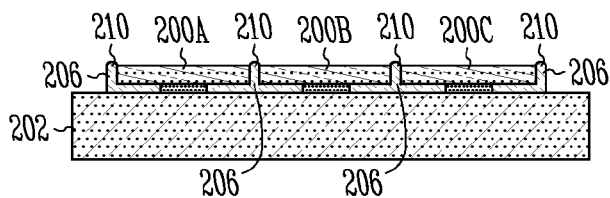
FIG. 2C shows an illustrative example of bumps in the streets, such as may be left after a filler in the streets has cured.

At 112 of FIG. 1, the streets 206 around the individual die 200 are filled with a filler substance. In certain examples, this involves first covering the planarized die 200 with a tape or other covering 208, such as shown in FIG. 2B. Next, the filler is introduced into the streets 206 between the die 200. In certain examples, the filler is injected laterally, such as into the streets 206. The filler can have a low viscosity (such as, for example, #377 low viscosity epoxy from Epotek) such that the filler flows (or even wicks) into or otherwise fills the streets 206. In certain examples, the filler can also fill certain unoccupied portions under the die 200, such as the portions around the adhesive portions 204. After the filler has cured, the tape or other covering 208 is removed. This can leave bumps 210 in the streets 206, such as shown in the example of FIG. 2C. These street bumps 210 typically rise above the planarized die fronts of the multiple IC die 200. The height of the street bumps 210 above the planarized die fronts of the multiple IC die 200 can be trimmed or otherwise reduced, if needed, such that the bump height falls within an acceptable depth of field for later-used semiconductor processing equipment (e.g., photolithography), such as discussed below.

At 112 of FIG. 1, the covering 208 of FIG. 2B provides a convenient way of keeping the filler in the streets and off of the front sides of the multiple IC die 200. However, the covering 208 is not required. In another example, a machine-positionable needle can be used to inject the filler into the streets 206 from the top, such as in the absence of the tape or other covering 208. A distal tip of the needle can be automatically moved along or through some or all of the streets 206, such as to dispense the filler into the streets 206.

Figure 2D:
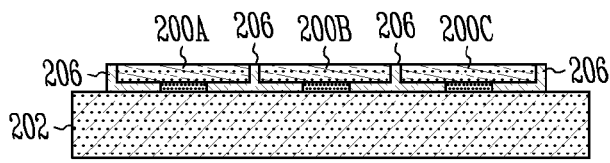
FIG. 2D shows an illustrative example of a result of reducing a height of street bumps.

At 114, if the height of the street bumps 210 above the planarized die fronts of the multiple IC die 200 exceeds an acceptable depth of field (about 1.0 μm, as an illustrative and non-limiting example) for later-used semiconductor processing equipment (e.g., photolithography), then the height of the street bumps 210 can be reduced, such as by chemical mechanical planarization (CMP), to a value that is acceptable for the later semiconductor processing. An illustrative example of the resulting structure is shown at FIG. 2D.

Figure 2E:
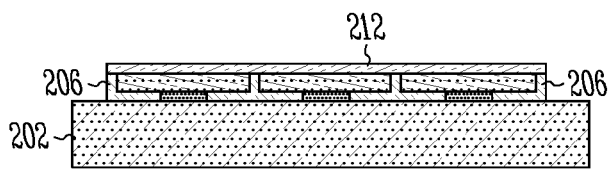
FIG. 2E shows an illustrative example of a result of forming a first insulator over die fronts and over the remaining street bumps in the streets.

At 116 of FIG. 1, a first insulator 212 (such as shown in FIG. 2E) is formed over the die fronts of the die 200 and over the remaining street bumps 210 in the streets 206. In an illustrative example, this includes spinning-on the insulator (such as an about 1 μm to 5 μm thick layer of Avatrel® from Promerus LLC of Brecksville, Ohio). The Avatrel® first insulator 212 can be cured, such as at about 160-180 degrees Celsius. Avatrel® provides elasticity to spread stress, and has similar dielectric properties to $SiO_2$. In certain other examples, the first insulator 212 can be polyamide, benzocyclobutene (BCB), $SiO_2$ or the like.

Figure 2F:
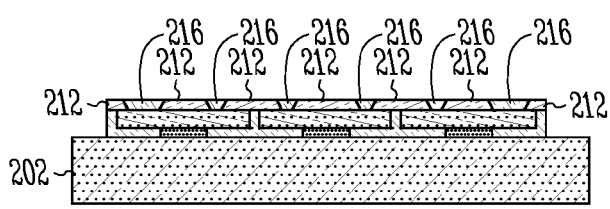
FIG. 2F shows an illustrative example of a result of selectively forming vias in the first insulator.

At 118 of FIG. 1, vias 216 (such as shown in FIG. 2F) can be selectively formed in the first insulator 212. The vias 216 can be defined photolithographically. For example, Avatrel® is a negative photoresist (PR) material. Therefore, unexposed portions of Avatrel can be selectively removed. Thus, portions of the first insulator at which vias 216 are desired can be shielded by a reticle during photolithographic exposure to light. Such unexposed portions will form the vias 216. Photolithographic via formation may involve exercising care that light reflection from underlying metal pads does not overexpose the overlying portions of the first insulator 212 at which the vias 216 are desired, thereby shrinking the size of the resulting vias 216 beyond a desired size.

Notably, creating the vias 216 photolithographically (e.g., as opposed to using reactive ion etching (RIE) to create the vias 216) allows a via 216 to be made larger than an underlying metal I/O pad on an IC die 200, if desired. By contrast, RIE generally requires the underlying metal I/O pad on an IC die to be at least as large as (and typically larger than) the overlying via (to allow for registration misalignment), since the underlying metal pad is typically used as an etch stop for the RIE process that creates the via.

Figure 2G:
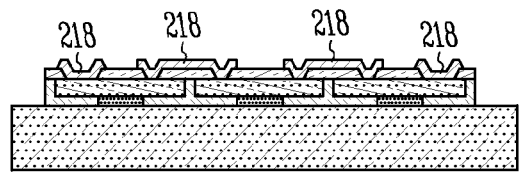
FIG. 2G shows an illustrative example of a result of forming a first conductive interconnect layer, such as by using semiconductor processing to interconnect different die.

At 120 of FIG. 1, a first conductive interconnect layer 218 (such as shown in FIG. 2G) is created, such as by using semiconductor processing (ordinarily applied to monolithic semiconductor wafers, rather than to an arrangement of picked-and-placed IC die), such as to permit formation of one or more conductive interconnection lines between different die 200. This typically involves metal deposition of the first conductive interconnect layer 218, such as within the vias 216 and elsewhere, followed by selective patterning of the first conductive interconnect layer 218 to form or pattern one or more desired conductive interconnection lines.

Figure 2H:
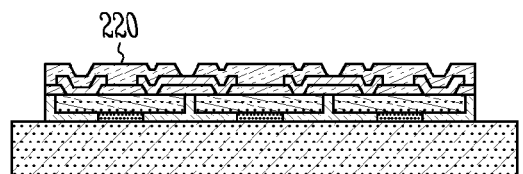
FIG. 2H shows an illustrative example of a result of forming a second insulator layer.

At 122 of FIG. 1, a second insulator layer 220 (such as shown in FIG. 2H) is created, such as described above with respect to the formation of the first insulator layer 212, or by using another semiconductor processing insulator formation technique.

Figure 2I:
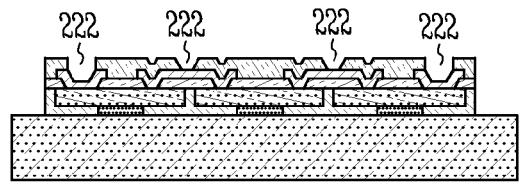
FIG. 2I shows an illustrative example of a result of forming vias in the second insulator layer.

At 124 of FIG. 1, vias 222 (such as shown in FIG. 2I) are created in the second insulator layer 220, such as described above with respect to the formation of the vias 216 or by using another semiconductor processing via formation technique.

Figure 2J:
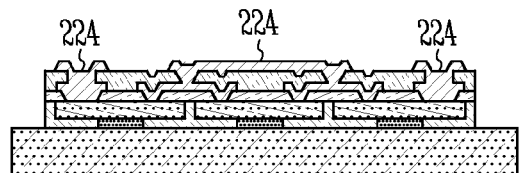
FIG. 2J shows an illustrative example of a result of forming a second conductive interconnect layer.

At 126 of FIG. 1, a second conductive interconnect layer 224 (such as shown in FIG. 2J) is created using a semiconductor processing technique, such as to permit formation of conductive interconnection lines between different die 200. This typically involves metal deposition of the second conductive interconnect layer 224, such as within the vias 216 and elsewhere, followed by selective patterning of the second conductive interconnect layer 224 to form or pattern the desired conductive interconnection lines.

Figure 2K:
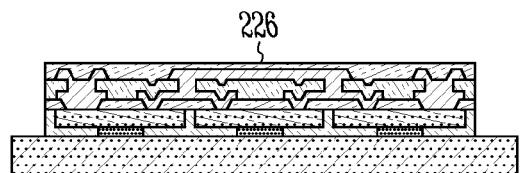
FIG. 2K shows an illustrative example of a result of forming a third insulator layer.

At 128 of FIG. 1, a third insulator layer 226 (such as shown in FIG. 2K) is created, such as described above with respect to the formation of the second insulator layer 226, or by using another semiconductor processing insulator formation technique.

Figure 2L:
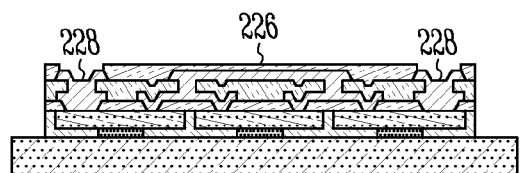
FIG. 2L shows an illustrative example of a result of forming vias in the third insulator layer.

At 130 of FIG. 1, vias 228 (such as shown in FIG. 2L) are created in the third insulator layer 226, such as described above with respect to the formation of the vias 216 or 222, or by using another semiconductor processing via formation technique.

After forming such interconnections between different IC die 200 attached to the same substrate, the resulting multi-die integrated assemblies can be singulated, and the resulting multi-die units can be used in any manner in which a conventional single IC die would otherwise be used, if desired.

The above-described process can be used to create high density interconnections between individual die 200. Since semiconductor wafer processing techniques are used to form interconnections between the individual IC die 200, the pitch between the inter-die interconnections can be the same or similar to the pitch between lines on the same IC die. This can effectively break down I/O barriers between die, allowing for greatly expanded functionality of a multiple IC die system. It can also obtain inter-die interconnection having the lower capacitance and faster speed on the order of that of an intra-die circuit interconnection. Moreover, it can save on pad space, thereby reducing die size and, in turn, reducing the size of a multiple-die system.

Furthermore, as discussed below, the above techniques can be used to create some rather unique and interesting structures, such as for programmably accessing one or more individual vias in a high density array of vias. This permits desired high-density connections to a particular IC die to be made even though that die was positioned using conventional pick & place equipment of limited alignment accuracy, such as discussed above. Still further, these and other techniques may be used to retrofit existing IC die, such as to connect individual minimum-linewidth or other fine or other lines on such die to other IC die.

Some Fixtures and Other Examples

Figure 3A:
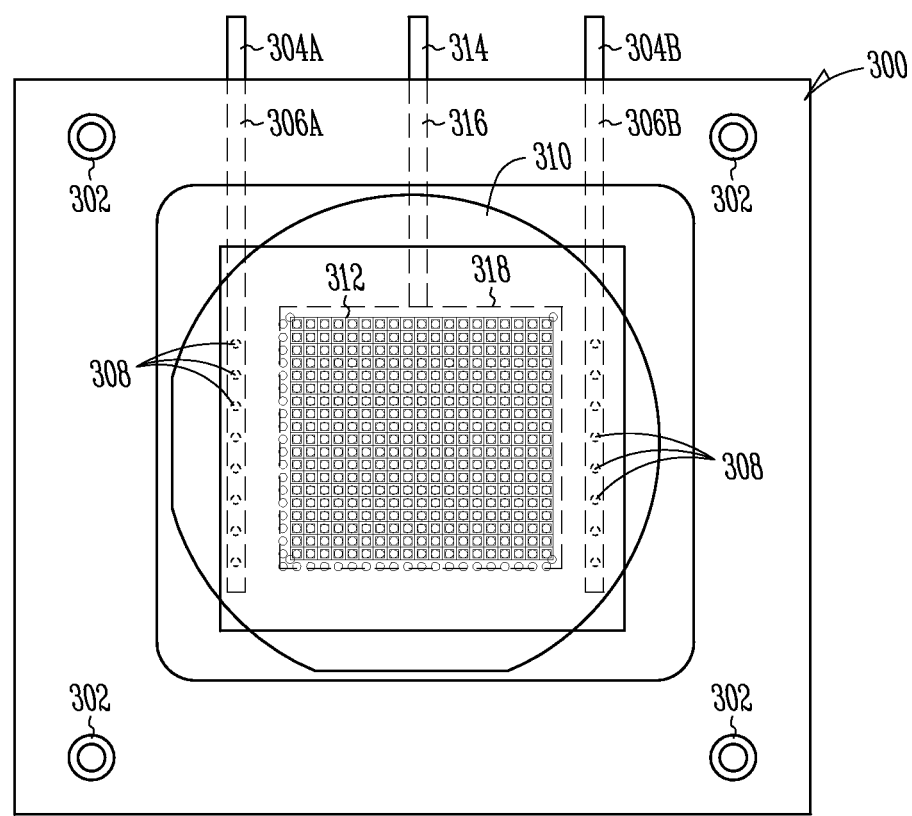
FIG. 3A shows an example of portion of a fixture for planarizing multiple IC die, where such fixture includes an upper stage.

FIG. 3A shows an example of portion of a fixture for planarizing multiple IC die 200, such as can be arranged and mounted on adhesive tape, as desired, such as by a pick-and-place apparatus, such as described above. In this example, an upper stage 300 can be raised or lowered, such as along one or more posts 302 or other guides. One or more vacuum ports 304A-B allow this example to deliver a vacuum, such as to one or more lumen or channel vacuum pathways 306A-B. In this example, one or more ports 308 can be distributed along one or more of the pathways 306. The ports 308 allow the vacuum to be applied to a flat planarizing disk 310, such as for holding the flat planarizing disk 310 in place against the upper stage 300. In certain examples, the flat planarizing disk 310 includes a semiconductor wafer through which pinholes 312 have been drilled, etched, or otherwise created. The pinholes 312 can be created on a two-dimensional grid or other arrangement that provides enough density of pinholes 312 to hold the arrangement of multiple IC die against the flat planarizing disk 310. In this example, a vacuum port 314 allows delivery of a vacuum to at least one lumen or channel vacuum pathway 316, which delivers the vacuum to a recessed chamber 318 region and, in turn, to the pinholes 312 in the flat planarizing disk 310 for holding the arrangement of multiple IC die against the planarizing disk 310. In certain examples, the vacuum is delivered from the recessed chamber 318 region to the pinholes 312 in the planarizing disk 310 via corresponding pinholes 313 in a barrier between the recessed chamber 318 and the planarizing disk 310. While applying a separate vacuum to port 314 than to ports 304A-B provides a convenient way to individually adjust the applied vacuum pressures, it is not required.

Figure 3B:
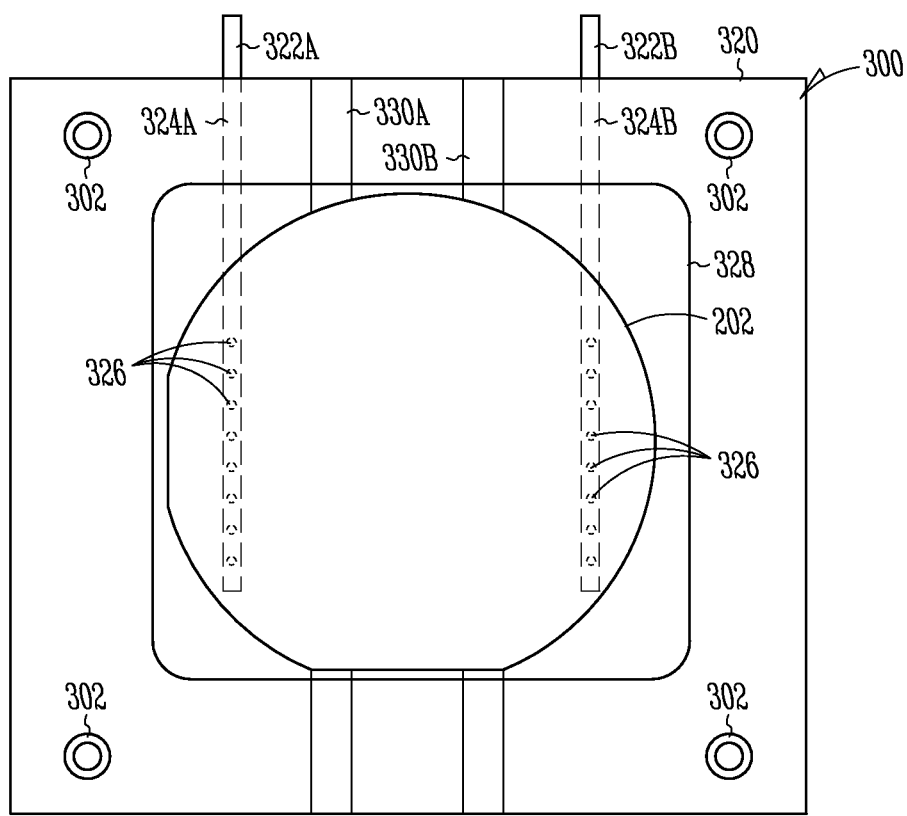
FIG. 3B shows an example of portion of the fixture for planarizing multiple IC die, where such fixture includes a lower stage.

FIG. 3B shows an example of another portion of the planarization fixture of FIG. 3A. In this example, a lower stage 320 can be arranged with respect to the upper stage 300, such as by using the one or more guides or posts 302 so that the upper stage 300 can be raised and lowered with respect to the lower stage 320. One or more vacuum ports 322A-B allow this example to deliver a vacuum to one or more lumen or channel vacuum pathways 324A-B. In this example, one or more vacuum ports 326, such as distributed along one or more of the vacuum pathways 324A-B. The vacuum ports 326 allow the vacuum to be applied to the flat semiconductor wafer or other removable substrate 202, such as for holding the substrate 202 in place against a portion of the lower stage 320. In certain examples, a recessed flat portion 328 is milled or otherwise formed in the lower stage 320, such as to accommodate the substrate 202, however, this is not required. Planarized IC die can be adhered to substrate 202, as such by using the process described above with respect to 110 of FIG. 1. In this example, one or more channels 330 are provided in an otherwise substantially flat surface of the lower stage 320, such as including the recessed portion 328. The channels 330 help ease liftoff of the substrate 320 from the lower stage 320, such as after the planarized IC die are adhered to the substrate 202, and the upper stage 300 is raised away from the lower stage 320.

FIG. 3C is a side view showing an example of a fixture 340 that includes the upper stage 300 riding on the guides or posts 302 extending upward from the lower stage 320. The flat planarizing disk 310 is shown held against the upper stage 300, such as by a vacuum applied via the channels 306 and the ports 308. A pick-and-placed arrangement of multiple IC die 200 is shown being held with the front sides of the multiple IC die 200 being held in planarity against the planarizing disk 310, after the adhesive tape 208 has been removed, such as described with respect to 106 of FIG. 1. After placing die attach adhesive in desired locations on the substrate 202 (or on the back sides of the IC die 200 themselves), such as described with respect to 108 of FIG. 1, the upper stage 300 can be lowered toward the lower stage 320. This permits the front-side planarized IC die 200 to be attached to the substrate 202. The upper stage 300 can then be raised away from the lower stage 320, such as to allow extraction of the substrate 202 to which the front-side planarized IC die 200 are attached. Other processing can then be performed, such as described above with respect to 112-130 of FIG. 1.

Some Structures and Other Examples

Figure 4:
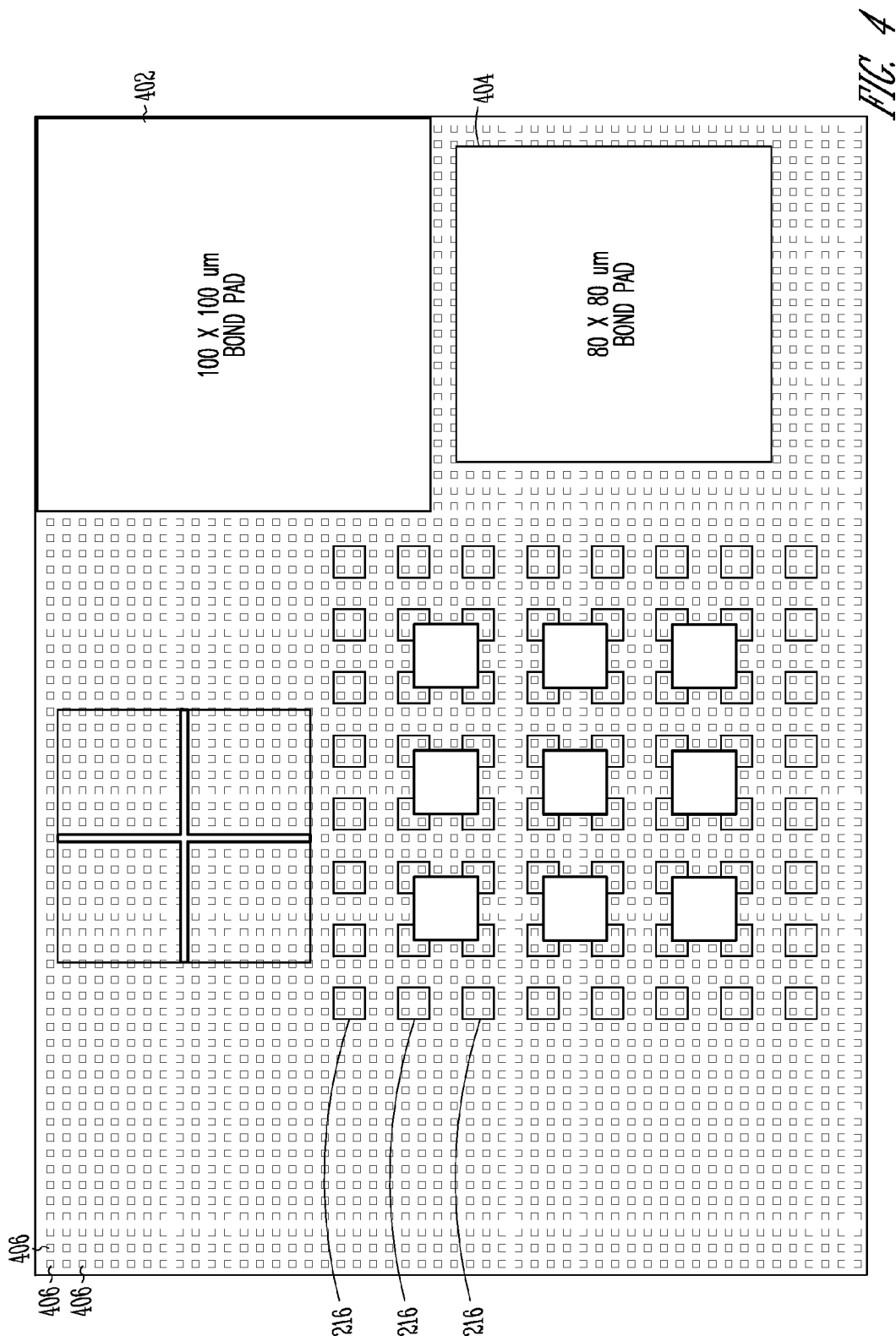
FIG. 4 is an illustrative example showing relative sizes of certain structures that can be formed, such as by taking advantage of some of the techniques described.

FIG. 4 is an illustrative example showing relative sizes of certain structures that can be formed, such as by taking advantage of some of the techniques described above. Among other things, FIG. 4 helps show how such techniques can be used to significantly improve IC die input/output (I/O) density. FIG. 4 conceptually shows a typical 100 μm by 100 μm I/O bonding pad 402 and a typical 80 μm by 80 μm I/O bonding pad 404. Such typical bonding pads 402 and 404 will occupy considerable space on an IC die. Moreover, if they are to be distributed around the periphery of an IC die, the number of such I/O bonding pads will be limited by the size of such periphery. Even if such periphery limitations are to be avoided, such as by moving the bonding pads away from the IC die periphery, and toward the center of the IC die, such I/O density will still be limited by the large size of the I/O bonding pads 402 and 404, which typically must be sized to accommodate a wire-bond or solder ball-bond connection to an off-chip location, such as to a location on a printed circuit board or another IC die.

By contrast, the FIGS. 1-3 describe how to use monolithic semiconductor wafer processing techniques to interconnect multiple IC die 200 that are picked-and-placed, and that need not form part of the same monolithic semiconductor wafer. This permits high density interconnection between the multiple IC die 200, which, in turn, allows use of I/O structures that are significantly smaller than the bonding pads 402 and 404.

For example, FIG. 4 shows a two-dimensional array or other two-dimensional arrangement of conductive I/O structures 406 that can be formed on a particular IC die 200. In FIG. 4, the I/O structures 406 are illustrated as 2 μm by 2 μm—which are much smaller than the 100 μm by 100 μm I/O bonding pad 402 or the 80 μm by 80 μm I/O bonding pad 404, as seen from the example of FIG. 4. Although I/O structures 406 are illustrated in FIG. 4 as being 2 μm by 2 μm, downward scaling of such size will be possible with any improvements in the particular semiconductor process used to fabricate the IC die 200 on which the I/O structures 406 reside. In general, the I/O structures 406 can be sized as small as a "minimum size" design-rule (for the particular semiconductor process) specified for the uppermost conductive intra-die interconnection layer (or for whatever intra-die interconnection layer is being used to form the I/O structures 406). For example, if the semiconductor process used to form the IC die 200 includes three-layers of "metal" interconnection on the IC die 200 (including a first formed metal layer ("M1"), an overlying second formed metal layer ("M2"), and a further overlying third metal layer ("M3")), then if the I/O structures 406 are to be formed using selectively patterned portions of the M3 layer, the I/O structures 406 can be sized as small as the minimum design rule for the M3 layer permits. However, the I/O structures 406 need not be sized so small, but can be made larger, if desired. If the I/O structures 406 are to be formed using selectively patterned portions of the M2 layer, then the design rule applicable to the M2 layer will limit the minimum size of the I/O structures 406. Such sizes stand in sharp contrast to the I/O bonding pads 402 and 404, which are typically many times larger, such as shown in FIG. 4, to allow connection to a wire or solder-ball.

The I/O structures 406 can be used to interconnect between different IC die 200 using certain monolithic semiconductor wafer processing techniques. In certain examples, this involves using vias 216 in an insulator 212 that overlies the I/O structures 406. In certain examples, a particular via 216 is actually made larger than the underlying I/O structure 406 to which it connects. As a result, in certain examples, a particular via 216 actually contacts multiple underlying I/O structures 406. However, the particular IC die 200 can be made programmable, such as to selectively couple only one of these I/O structures 406 to the particular overlying via 216 that contacts such multiple I/O structures 406. As described above, having a via 216 that is actually larger than the underlying I/O structure 406 is unusual, because an etching-based via-formation process would typically require the underlying bonding pad 402 or 404 to be larger than the overlying via, so that the underlying bonding pad 402 or 404 can be used as an etch-stop. An etch-stop is more resistant to the etchant than the overlying layer, such that when the etchant reaches the etch-stop, it does not significantly etch further under typical processing conditions. By contrast, using photolithographic or other non-etching based via formation techniques to form the vias 216 will avoid any such need for an etch-stop. This permits a particular via 216 to be larger than the underlying structure to which it contacts.

Having a particular via 216 that is larger than an underlying I/O structure 406 allows the IC die 200 to be programmed such that the area of a particular via 216 fully encompasses the particular underlying I/O structure 406 that is programmed to be accessed by the via 216. In the illustrative but non-limiting example of FIG. 4, each I/O structure 406 is 2 μm by 2 μm, arranged in an two-dimensional x-y grid array, with each I/O structure 406 separated from any adjacent I/O structure 406 by a 2 μm separation distance, also referred to as a "pitch." Each via 216 is shown in this illustrative example as being 8 μm by 8 μm, such that, when sufficiently aligned, the area of each via 216 can encompass four underlying 2 μm by 2 μm I/O structures 406. However, an x-y grid array (or other arrangement) of the vias 216 need not be perfectly aligned to an x-y grid array (or other arrangement) of the underlying I/O structures 406, such as explained further below.

Figure 5A:
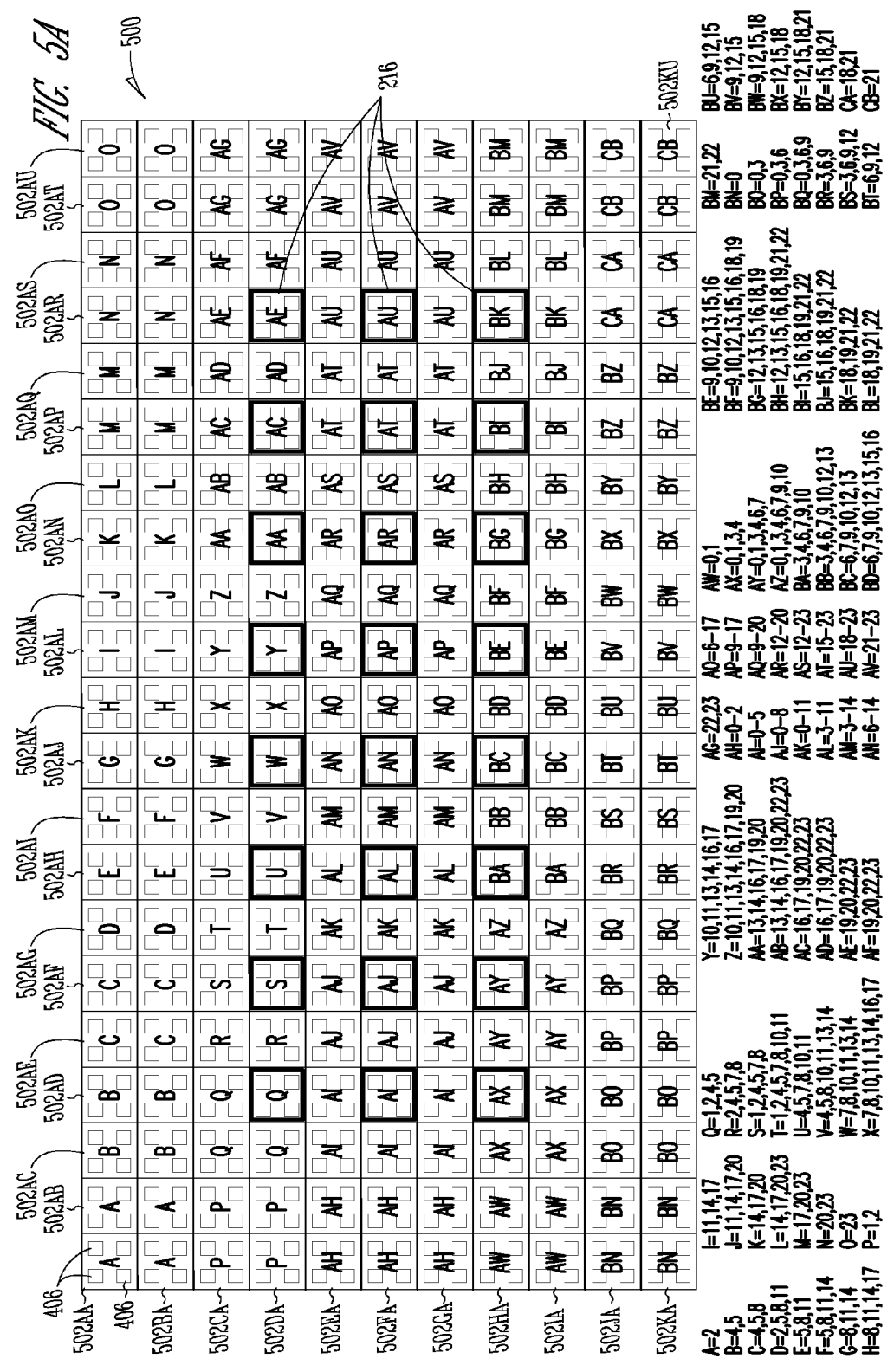
Figure 5B:
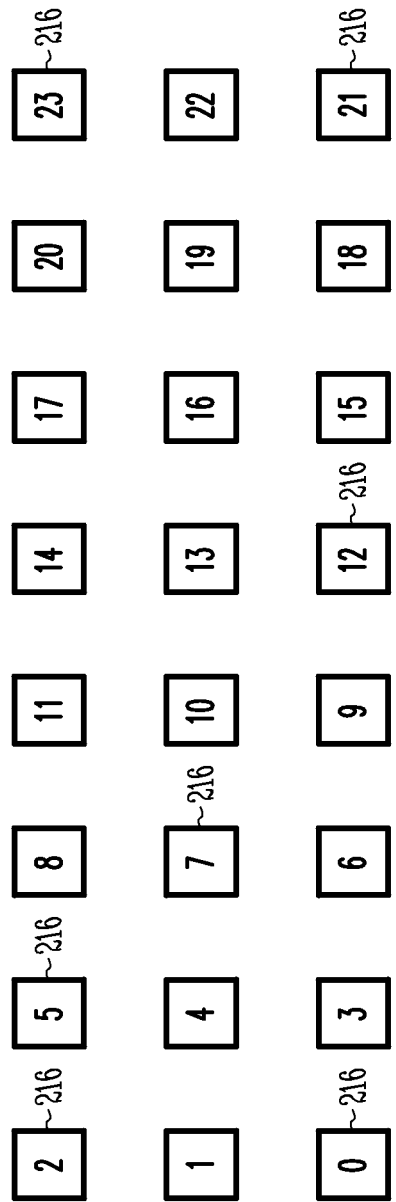
FIG. 5B provides an illustrative numbering for the vias of FIG. 5A.

FIG. 5A is an illustrative but non-limiting example of a three by eight (3×8) x-y grid array 501 of twenty-four 8 μm by 8 μm vias 216. FIG. 5B provides an illustrative numbering for this illustrative example of the vias 216. In this example, these twenty-four vias 216 (which can be numbered 0-23, as shown in FIG. 5B) are shown overlaying an x-y grid array 500 of underlying 2 μm by 2 μm I/O structures 406. The area defined by the x-y grid array of the I/O structures 406 is larger than the area defined by the x-y grid array of the vias 216. FIG. 5 illustrates a particular illustrative example in which alignment error between the x-y grid arrays of the vias 216 and x-y grid array of the I/O structures 406 (for example, due to pick-and-place errors at 102 of FIG. 1 or other possible sources of misalignment) is less than or equal to +/−24 μm. As a result, the illustrated vias 216 can potentially land anywhere on the larger shown x-y grid array of underlying I/O structures 406. For example, if the x-y grid array of the vias 216 could be misaligned, so as to be shifted 24 μm to the left, to the right, upward, downward, left and upward, right and upward, left and downward, or right and downward—and the entire array of vias 216 would still fall within the x-y grid array of the underlying I/O structures 406 shown, because of the larger size selected for the x-y grid array of the underlying I/O structures 406 to accommodate any such misalignment.

In the illustrative example of FIG. 5A, the I/O structures 406 are shown as being conceptually divided into 8 μm by 8 μm square or other cells 502. Each cell 502 includes four I/O structures 406, in this example. Each cell 502 is adjacent to at least two other cells 502. Also noted in FIG. 5A on each cell 502, is a list of one or more vias 216 that could potentially land on that particular cell 502. For example, cell 502AA may end up being aligned to via #2 (via numbering is shown in the separate FIG. 5B to preserve the clarity of FIG. 5A), as may cells 502BA, 502AB, and 502BB. Cells 502CA, 502CB, 502DA, and 502DB may end up being aligned to via #1 or via #2. FIG. 5A uses a shorthand letter notation for certain combinations of vias. For example, cell 502CK may end up being aligned to "X", where "X" is a shorthand notation that represents vias #7, #8, #10, #11, #13, #14, #16, and #17, as indicated on FIGS. 5A and 5B.

A particular IC die 200 can include programmable circuitry to programmably route a number of I/O lines on the particular IC die 200 to corresponding vias 216. Since the illustrative example of FIGS. 5A and 5B shows twenty-four such vias 216, in that example, up to twenty-four I/O lines can be programmably routed to such vias—and this can be accomplished in an area that is 160 μm by 88 μm, which is about 14,080μm². This provides an I/O density of about 587 μm² per I/O, which compares extremely well with the 10,000 μm² per I/O density of the 100 μm by 100 μm bonding pad 402 of FIG. 4, or the 6,400 μm² per I/O density of the 80 μm by 80 μm bonding pad 404 of FIG. 4. Moreover, the I/O density shown in FIG. 5 is scalable with improvements in semiconductor processing, while the size of the bonding pads 402 or 404 of FIG. 4 are limited by wire-bonding solder-ball bonding, or similar limitations that are believed likely more difficult to scale smaller in size.

Figure 6:
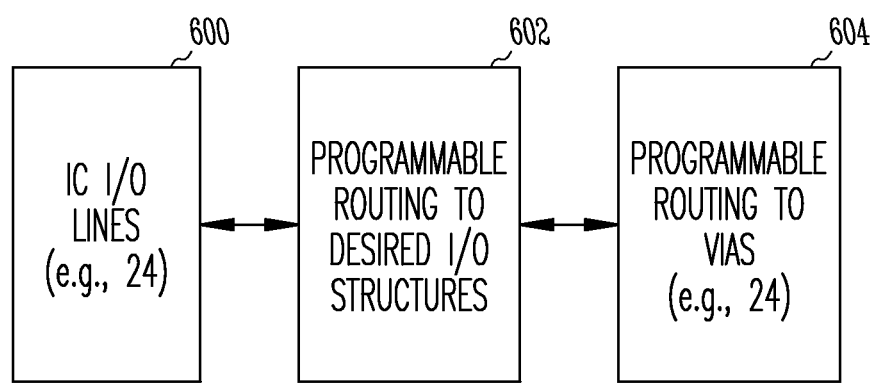
FIG. 6 is a block diagram illustrating, such as for the example of FIGS. 5A and 5B, routing IC I/O lines to vias.

FIG. 6 illustrates, such as for the example of FIG. 5A, at 600, a number of I/O lines on a particular IC die 200. In the example of FIG. 5A, there would be twenty-four such I/O lines. At 602, such I/O lines are routed to desired I/O structures 406. At 604, such I/O structures 406 are programmably routed to the desired vias 216. In the example of FIG. 5A, there would be twenty-four such vias.

FIG. 7 is a spatial representation, for the example of FIG. 5A, of how many multiplexer select lines or other routing inputs are needed for each cell 502, which, for a particular cell 502, depends on how many vias 216 may potentially align with that particular cell 502, as illustrated in FIGS. 5A and 5B.

Figure 8:
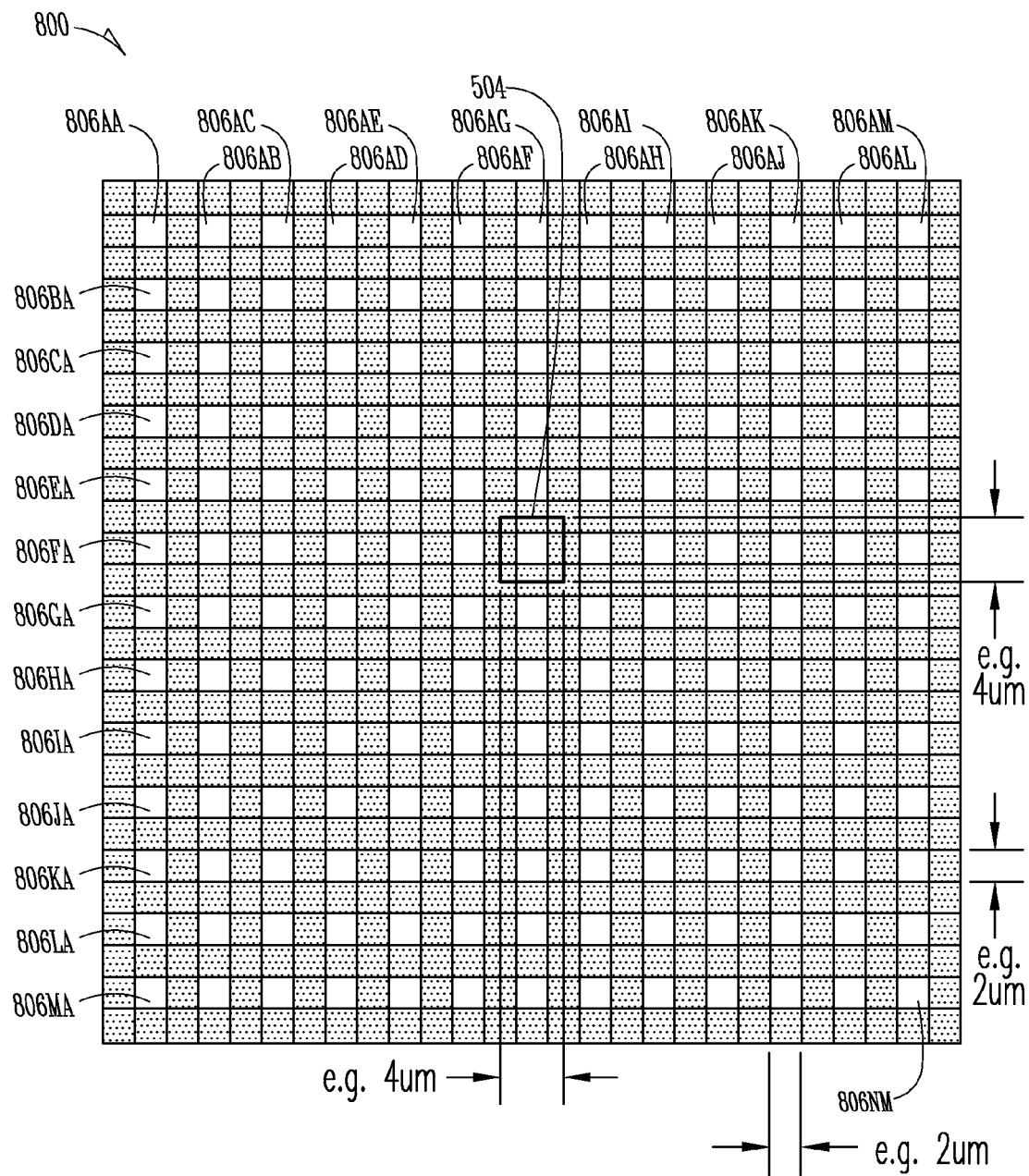
FIG. 8 illustrates an example of an x-y alignment grid array of I/O contacts and an overlying alignment via.

To properly route the desired I/O lines on a particular IC die 200 to the correct vias 216, it is useful to obtain information about what the actual alignment is between the vias 216 and the underlying I/O structures 406. Therefore, FIG. 5C illustrates inclusion of an alignment target structure 503 and an alignment via 504, which is typically smaller than the other vias 216, but still larger than an underlying I/O structure 406. In the non-limiting example of FIG. 5C, the alignment via 504 is illustrated as being 4 μm by 4 μm in size. The alignment target structure 504 (to which the alignment via 504 is typically positionably aligned) is typically located such that the alignment target structure 503 and the alignment via 504 lie outside of the pick-and-place or other alignment error range (e.g., represented by the perimeter of the x-y grid array 500 of the cells 502), and such that the alignment via 504 falls within the alignment target structure 503. A more detailed example of an alignment target structure 503 is illustrated by an alignment grid array 800, such as shown in FIG. 8. FIG. 5C illustrates an example of multiple alignment target structures 503A-B and corresponding alignment vias 504A-B, which are placed along a diagonal from the array 500 of the cells 502 and the array 501 of the vias 216. This permits determination of misalignment in x and y directions as well as determination of rotational misalignment.

FIG. 8 illustrates an example of an alignment target structure 503 such as an x-y alignment grid array 800 with I/O structures 806 that are sized and pitched identically to the I/O structures 406 of FIG. 5A. However, the I/O structures 806 are individually addressable so as to be able to detect the location contacted by the alignment via 504 which, as illustrated in the example of FIG. 8, will only contact one, two, three, or four of the I/O structures 806. Knowing this information about the misalignment of the alignment via 504 with respect to its grid array 800, one can determine the actual misalignment of the vias 216 with respect to the array 500 and, knowing this information enables proper routing of the twenty-four I/O lines on the IC in the example of FIG. 5A to the twenty-four vias 216 illustrated in the example of FIG. 5A.

In FIG. 8, the location contacted by the alignment via 504 can be determined, in certain examples, by one-by-one interrogation of the I/O structures 806. In another example, a signal can be injected at the alignment via 504, and the particular I/O structure(s) 806 contacted by the alignment via 504 can be determined by reading row and column addressing lines associated with the array 800 of I/O structures 806.

Using a single alignment target structure 503A, such as a single alignment grid array 800, permits the amount of X and Y misalignment to be determined at the location of the corresponding alignment via 504A. In another example, such as shown in FIG. 5C, a pair of alignment target structures 503A-B are used, along with a corresponding pair of alignment vias 504A-B. In the example of FIG. 5C, the alignment target structures 503A-B are located on opposing sides of the array 500, such as at diagonally opposing locations, as an illustrative example. Using two or more alignment target structures 503 enables determination of a rotational error term, called "theta", as well as the center-of-rotation X and Y displacement terms. The X, y, and theta information can be calculated by analyzing the location information of the alignment vias 504. This information, in turn, can be used to calculate the misalignment of the vias 216 with respect to the array 500. Such information, in turn, can be used to program the desired routing for the vias 216, in spite of the pick-and-place or other misalignment of the vias 216 with respect to the array 500.

The example described herein, such as for example with respect to FIGS. 4-8, illustrates particular sizes and numbers only for the benefit of providing a conceptually clear concrete example to the reader. Other implementations can use different sizes, different numbers or arrangements of I/O lines, I/O structures, vias, or the like. Moreover, although the above examples have used "vias" as the I/O structures, certain of the above techniques can also apply to using other I/O structures, such as "bumps" instead of "vias".

Some Other Examples, Variations, and Improvements:

The above description included examples of planarizing multiple integrated circuit die, such as by placing the front sides of the die against a planarizing wafer through which a vacuum is applied. In another example, a magnetic force can be used for performing such planarization, such as by placing the front sides of the die against a planarizing wafer, placing a magnetic paste or other magnetic material on the back sides of the die, or on the film behind the die, and applying a magnet to the side of the planarizing wafer that is away from the front sides of the die to create a magnetic field that holds the front sides of the die against the planarizing wafer.

In another example, the process described above with respect to FIG. 1 can be modified. At 102, the multiple IC die can be placed onto a removable adhesive tape carrier, such as by using an automated IC die pick-and-place apparatus to perform the placement. Then, removable adhesive tape or another barrier can be placed against the IC die fronts, before the IC die fronts are planarized at 104. The order of these two operations can be reversed, such that the IC die are automatically picked-and-placed such that their die fronts (with the active area of the circuitry) contacts a first adhesive tape, and a second adhesive tape is then placed over the IC die backs, then the die fronts are placed against a planarizing surface, such as a pinhole wafer through which a vacuum can be applied. A liquid filler can be injected into the streets between the IC die to bond the IC die together, and the liquid filler can be at least cured to harden, such as at least in part while the IC die fronts are being planarized at 104. At 106, the adhesive tape carriers can be removed (e.g., both frontside and backside). Thus, in certain examples, the IC die need not be attached to a substrate, such that acts 108, 110, 112, and 114 of FIG. 1 can optionally be omitted. This can help avoid warpage, such as can possibly occur when the die are adhesively attached to a wafer substrate.

Figure 9:
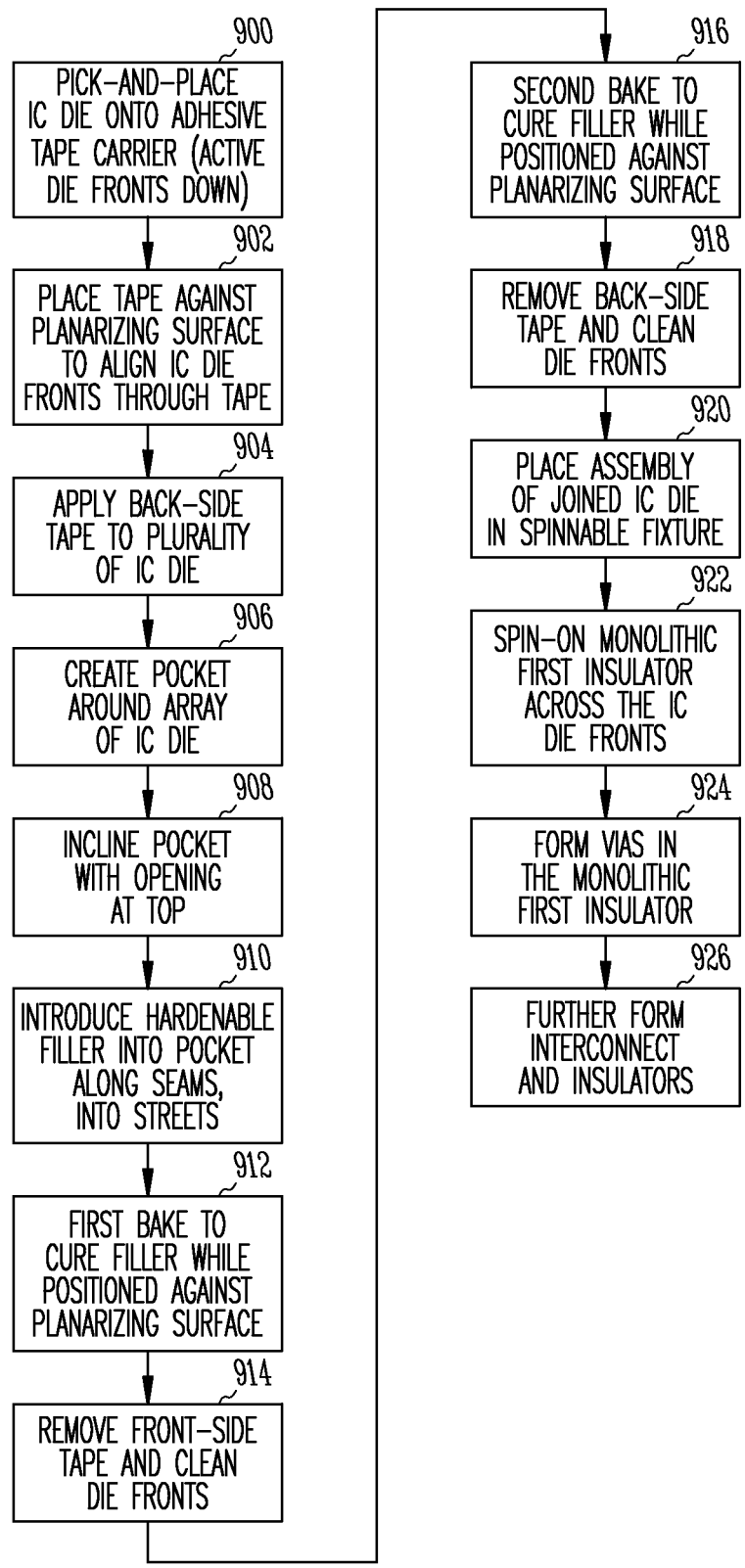
FIG. 9 illustrates generally in more detail certain aspects of an illustrative example of portions of such a method of forming an assembly of multiple laterally attached and planarized IC die.
Figure 10A:
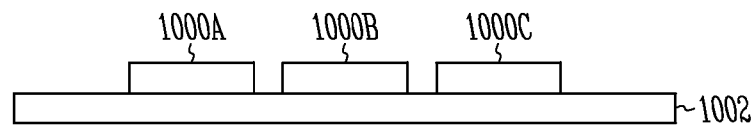
FIGS. 10A-10H illustrate generally various stages of the method of FIG. 9.

FIG. 9 illustrates generally in more detail certain aspects of an illustrative example of portions of such a method of forming an assembly of multiple laterally attached and planarized IC die. At 900, a pick-and-place machine can be used to automatically pick-and-place IC die onto an adhesive tape carrier, such that the die fronts (with respective "active areas" including circuitry) are placed down such that they contact and stick to an adhesive side of a polyimide or other adhesive tape. This provides a desired arrangement of multiple IC die, such as to permit subsequent interconnecting of adjacent IC die. With the die fronts contacting the adhesive side of the adhesive tape, the non-adhesive other side of the adhesive tape can be placed against a planarizing surface to substantially planarized the die fronts, such as described below. FIG. 10A shows an example in which IC die 1000A, 1000B, 1000C, etc. have been mechanically picked-and-placed, active side down, onto an adhesive side of an adhesive tape carrier 1002.

Figure 10B:
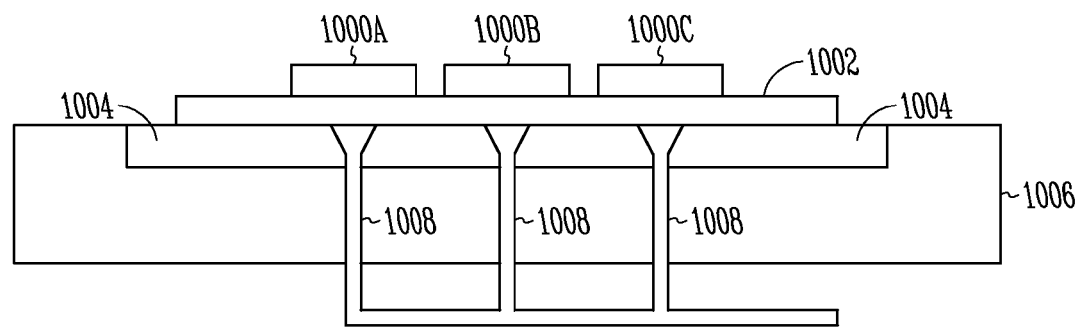

At 902 in FIG. 9, a non-adhesive side of the adhesive tape carrier can be placed against a planarizing surface such as, for example, a flat pinhole wafer through which a vacuum can be applied. The vacuum pulls the tape toward the planarizing surface and, through the tape, substantially aligns the surfaces of the front sides of the IC die, which are attached to the adhesive side of the tape. The tape can be compliant enough to substantially maintain planarity of the IC die fronts even while accommodating particles as large as 0.002 inches between the non-adhesive side of the tape and the planarizing surface. Such particles can tend to be partially or completely embedded in the thickness of the tape. FIG. 10B shows an example in which the IC die shows an example in which IC die 1000A, 1000B, 1000C, etc. have been mechanically picked-and-placed, active side down, onto an adhesive side of an adhesive tape carrier 1002, which is drawn against a flat wafer 1004 with through-pinholes through which a vacuum can be applied. The wafer 1004 rests in a receptacle of a vacuum fixture 1006, which includes passages 1008 that communicate with the through-pinholes in the flat wafer 1004 for applying a vacuum.

At 904, another piece of polyimide or other adhesive tape can be applied to stick to the back sides of the plurality of IC die that were picked-and-placed at 900. The adhesive tape can be compliant enough to accommodate varying IC die thicknesses of the IC die that are sandwiched between the two layers of adhesive tape. In certain examples, the sandwich of the two layers of adhesive tape can even accommodate the larger or smaller thicknesses of any discrete components, different than IC die, that were also optionally picked-and-placed at 900.

At 906, a "pocket" is formed around the array of IC die that are sandwiched between the two layers of adhesive tape. In an illustrative example, a three-sided pocket can be formed by adhering the back-side tape (attached to the back-sides of the IC die) to the front-side tape (attached to the front-sides of the IC die) along three sides of a four-sided perimeter about a square or rectangular array of picked-and-placed IC die. In another illustrative example, a four-sided pocket can similarly be formed by adhering the back-side tape to the front-side tape along all four sides of the four-sided perimeter about the square or rectangular array of sandwiched picked-and-placed IC die. In either case, this can be performed while the front-side tape is being drawn toward the planarizing surface by the applied vacuum.

Figure 10C:
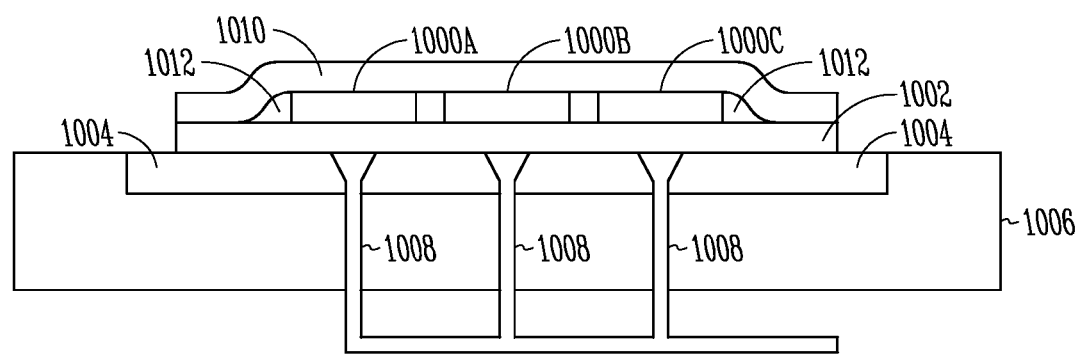

If the front-side tape is maintained substantially flat against the planarizing surface, including at the perimeter of the array of picked-and-placed IC die, and the back-side tape tapers toward the front-side tape at an approximately 45 degree angle, then there can be a substantial open volume along the peripheral "seams" of the three-sided or four-sided pocket, which will allow a fluid adhesive to flow nicely therethrough. For example, if the IC die are about 0.009 inches thick, then the cross-sectional area through which a fluid adhesive can flow along the pocket seams will be about (0.009×0.009)/2=0.0000405 square inches. In certain examples, there is more cross-sectional area available for a fluid adhesive to flow through along the seams of the pocket than in the streets between the IC die. This permits the fluid adhesive to fill in along the seams first, before filling in the streets. This can be used to avoid trapping air bubbles within the fluid adhesive, as described below. FIG. 10C shows an example in which a second piece of adhesive tape 1010 has been placed over the IC die 1000A, showing the open cross-sectional areas of parallel seams 1012.

At 908, the flat pocket can be inclined at an angle. This can make use of gravity when introducing a fluid adhesive into the pocket. In certain examples, an incline of about 45 degrees can be used. This need not involve using a planarizing surface other than the tape. For example, if the IC die were planarized against a pinhole wafer through which a vacuum were applied, such vacuum can be removed, and the taped pocket can then be removed from the pinhole wafer planarizing surface before inclining. However, in certain examples, inclining does involve placing the flat pocket (carrying the sandwiched IC die) against the planarizing flat pinhole wafer, through which a vacuum is applied. The planarizing flat pinhole wafer can be inclined, so as to incline the flat pocket carrying the sandwiched IC die.

Figure 10D:
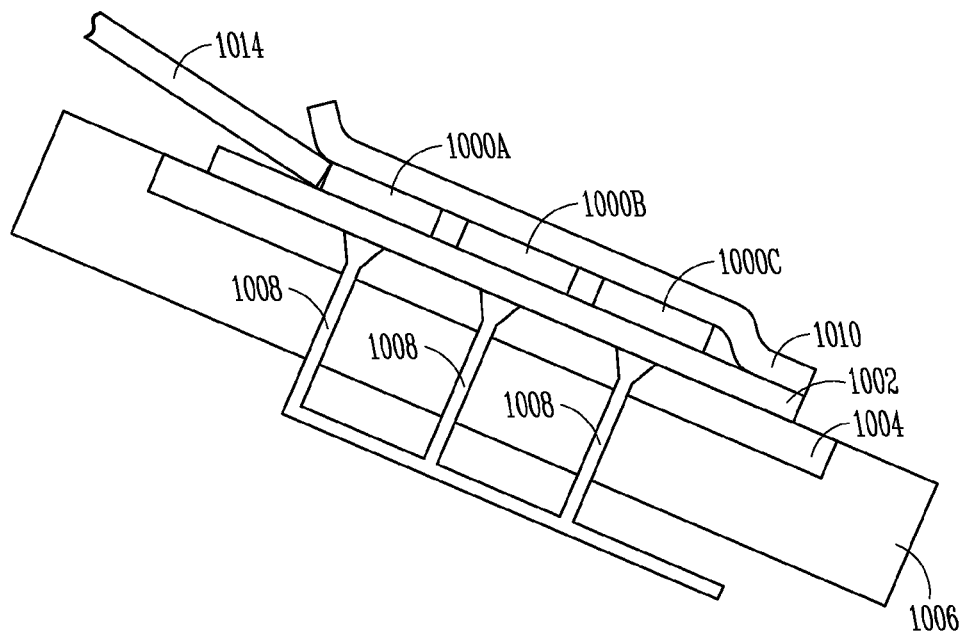

At 910, a fluid adhesive is introduced into the inclined pocket. For example, if a three-sided pocket is used, the fluid adhesive can be introduced into the open side of the pocket, which can be oriented at the top of the incline, such that the fluid flows down along one of the seams forming a side of the pocket. In another example, in which a four-sided pocket is used, a small opening can be formed at the top of the incline at one of the side seams running down the incline. A syringe can be inserted into the small opening to deliver the fluid adhesive into the pocket along the side seam running down the incline. In certain examples, a second small opening can be formed at the top of the incline at the other of the side seams running down the incline. A second syringe can be inserted into this second small opening and used to actively or passively exhaust air from the pocket as the fluid adhesive is being introduced through the other opening via the other syringe. In certain examples, introducing the fluid adhesive includes injecting #377 low viscosity epoxy from Epotek. This can be done at an elevated temperature, such as a temperature that is between about 60 to 80 degrees Celsius, for example. Because of the relatively large cross-sectional area available along the seams, the fluid filler can tend to flow in the pocket down the incline along the side seam into which the fluid filler is introduced, then along the bottom seam, and then up the incline along the opposing side seam, at least in part, before flowing into the narrower streets between the IC die in the two-dimensional array of IC die. This inclined arrangement helps the filler flow evenly into the streets between the IC die. It also allows air to be expelled upward along the incline and out the top of the pocket, such as via the exhaust syringe arrangement described above. This helps avoid air bubbles becoming entrapped in the epoxy filler in the streets. When the streets have been filled, injection of the filler can be stopped, and the injector can be pulled away. Then, if desired, the tape can (but need not) be used to close off the fourth side of the pocket. FIG. 10D shows an example of injection of a fluid filler at an incline, such as by using a syringe or other injection source 1014. This results in filling in the streets between the IC die, while the front sides remain in substantially planar alignment, substantially without also continuously filling regions under back sides of the first and second integrated circuit die, which can add thermal stress and can result in warpage.

At 912, the filler is soft-baked to help partially cure the filler, such as at an elevated temperature of between about 80 degrees Celsius and about 160 degrees Celsius, such as for a time period of less than about 2 hours. Additionally or alternatively, a ultraviolet (UV) light energy can optionally be used to partially cure or help partially cure a UV-curable filler (e.g., other than #377) if desired. The soft-bake for curing the filler is performed while the taped (3-sided or 4-sided) pocket of IC die is held firmly against a planarizing surface, such as a pinhole wafer through which a vacuum is applied, with the front sides of the IC die toward the planarizing surface. After removing the vacuum from the pinhole wafer, the taped pocket can then be pulled away from the planarizing surface, flipped over, and placed and vacuum-held against the planarizing surface with the back sides of the IC die toward the planarizing surface.

Figure 10E:
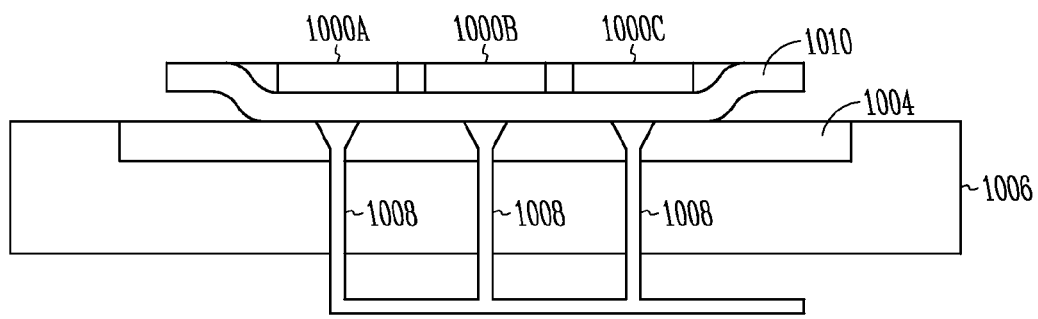

At 914, the tape is removed from the front-sides of the IC die, leaving the assembly as shown in the example of FIG. 10E, in which the IC die 1000 have their die fronts (with active areas) facing up, and the die backs vacuum-drawn toward the planarizing pinhole wafer 1004 through the back-side tape 1010. If the topology resulting from varying thickness IC die or other components is too severe to hold a vacuum via a planarizing wafer, another technique of holding can be used. The die fronts are optionally cleaned, such as to reduce or remove any residue left behind by the adhesive tape. This can include using a solvent, such as isopropyl alcohol, that does not adversely impact the epoxy or other filler in the streets between the IC die. After removing the vacuum from the pinhole wafer, the back-side taped array of IC die can then be pulled away from the planarizing surface, flipped over, and placed and held against the planarizing surface with the front sides of the IC die facing toward and held against the planarizing surface by the applied vacuum.

Figure 10F:
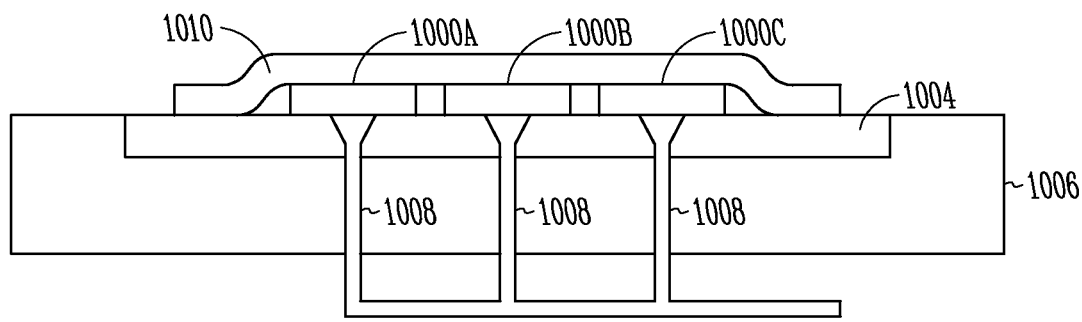

At 916, the die fronts are placed against the planarizing surface, such as the pinhole wafer through which a vacuum can be applied, such as shown in the example of FIG. 10F. While the IC die fronts are drawn toward the planarizing surface, such by the vacuum, the epoxy filler can be further cured in a "hard-bake", such as at an elevated temperature of between about 180 to 220 degrees Celsius for a time period that is less than about 1 hour.

Figure 10G:
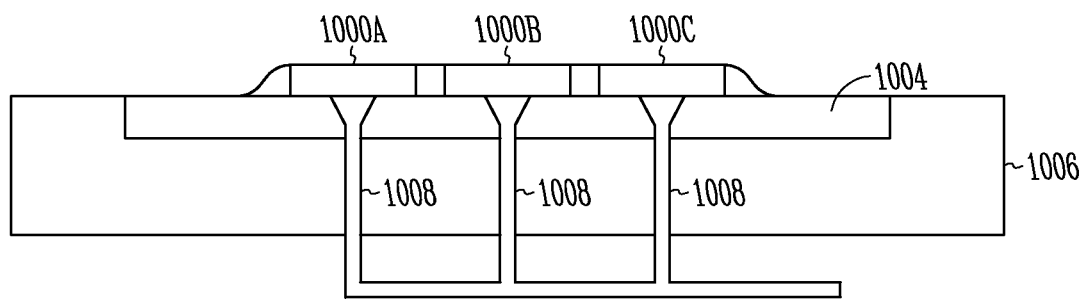

At 918, the back-side tape is removed (either before or after the hard-bake of 916), such as while the IC die fronts are still being held against the planarizing surface, leaving the assembly as shown in the example of FIG. 10G. Then, the vacuum is removed. This permits removal of the assembly of a plurality IC die that are joined together laterally, at this juncture, by only the epoxy filler in the streets between the IC die, and along the peripheral seams or edges of the array of IC die. The IC die fronts can then be optionally cleaned, if desired, such as by using a solvent, such as isopropyl alcohol, that does not adversely impact the epoxy or other filler in the streets between the IC die.

Figure 10H:
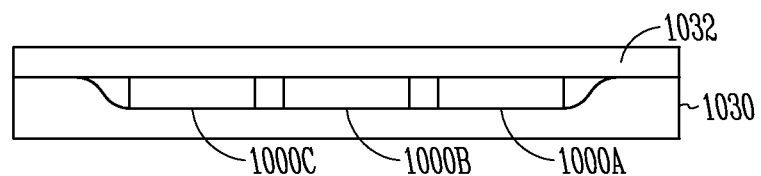

At 920, the assembly of the plurality of IC die (which are joined together, at this juncture, by only the epoxy filler in the streets) is placed onto a spin stand compatible fixture or chuck 1030, such as shown in the example of FIG. 10H, such as with the die fronts facing outward. In certain examples, the assembly of the plurality of the IC die can be a square or rectangular array (or any combination of such square or rectangular arrays), which can be placed in a similarly-sized square or rectangular recess of circular disk-like chuck, which can be made from a semiconductor wafer. The chuck, and the assembly of the plurality of IC die, which is carried by the chuck, can be spun while a liquid insulator is applied, such as described below.

At 922, a monolithic insulator 1032 can be formed across the IC die fronts and across the streets between the die fronts, such as shown in the example of FIG. 10H. In certain examples, this can include spinning-on an insulator, such as a negative or positive photoresist or about 1 μm to 5 μm thick layer of Avatrel®. Using a circular disk-like chuck (into which the assembly of the plurality of joined IC die is placed into a recess), instead of merely spinning the square or rectangular assembly of IC die, helps reduce or avoid stringing of the spun-on material.

At 924, the Avatrel® can be photolithographically exposed and developed to form via regions at desired locations over the IC die, such as explained above. In certain examples, the Avatrel® provides a negative photoresist material that can be photolithographically developed, however, if available, a positive photoresist material can be used. In either case, the vias in the monolithic insulator permit interconnection of different IC die in the assembly of the plurality of IC die, which, at this juncture, is connected by the filler in the streets and the commonly overlaid insulator that was spun-on or otherwise formed. The vias need not be formed photolithographically. If desired, the vias can be formed by reactive ion-etching. In another example, the vias can be formed by nano-imprinting. The spun-on Avatrel® with the vias formed therein can then be cured at an elevated temperature, such as at a temperature between about 180 degrees Celsius and about 240 degrees Celsius.

At 926, a metal or other conductive layer is selectively formed, or formed and selectively removed, such as to interconnect desired vias, to form contact structures, or to perform another desired circuit function. In certain examples, this can include deposition of metal, such as can be performed in semiconductor wafer processing. In certain examples, this can include electroless plating (e.g., of Al, Cu, or another desired metal), which can provide better step coverage, particularly in steeply defined vias that can result from photolithographically exposing Avatrel®. Additional insulator or conductive layers can then be formed, such as described above. Multiple layers of insulator and metallization can be formed, as desired. For example, a Damascene or dual-Damascene process can be used to selectively provide multiple layers of insulator and metallization, as desired.

Pairs or other pluralities of IC die can be sawed apart or otherwise separated, as desired, and packaged, if desired. The die can interconnect to each other at high inter-die I/O interconnect densities, as explained above.

Figure 11:
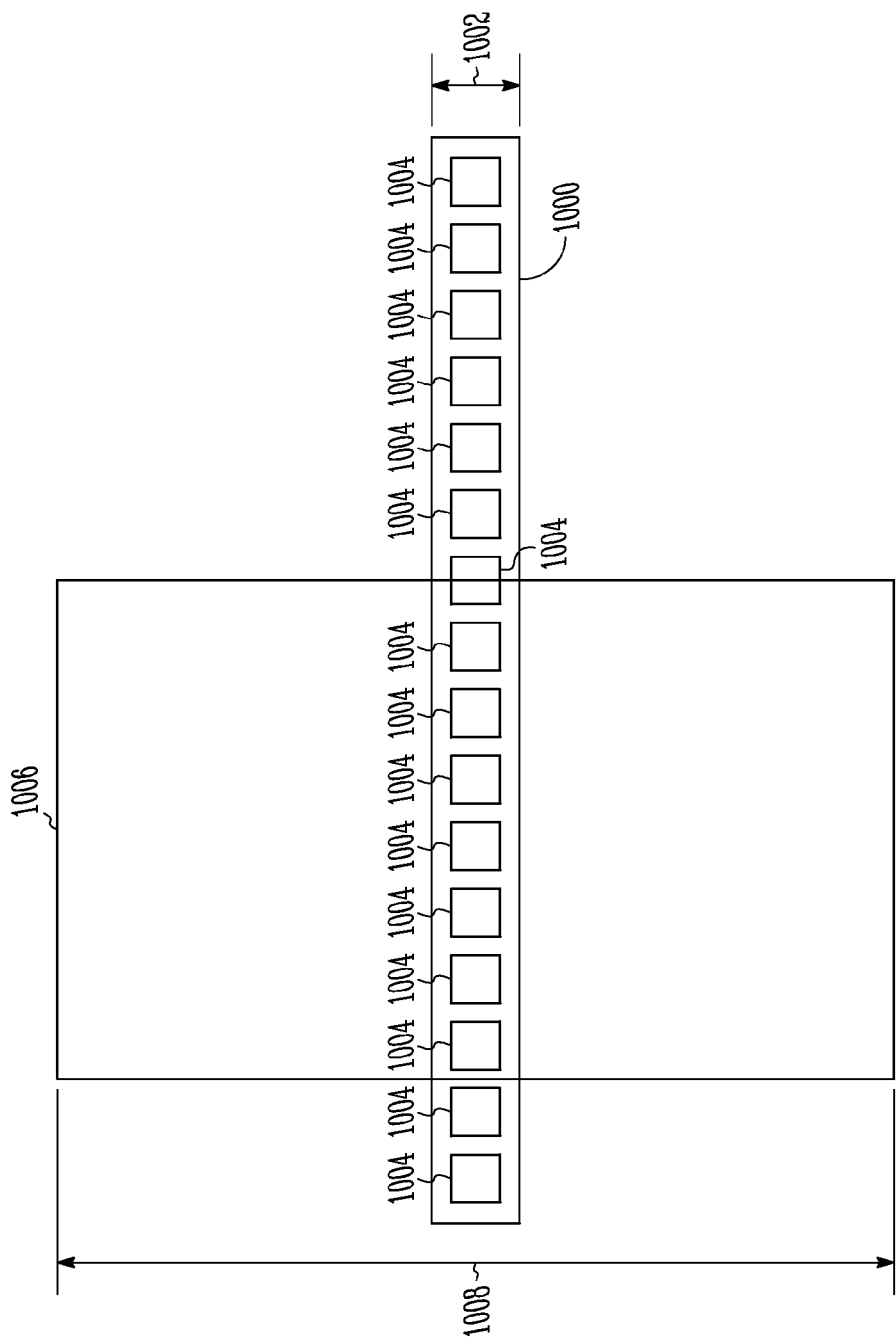
FIG. 11 is a schematic diagram illustrating generally an example of using the present technique to retrofit a connection to the existing IC die.

FIG. 11 is a schematic diagram illustrating generally an example of using the present technique to retrofit a connection to the existing IC die—even to a minimum linewidth conductive line on the existing IC die. In FIG. 11, a top layer metal or other conductive internal (on-IC die) interconnection line 1000 on an existing IC die has a minimum linewidth 1002 permitted by a semiconductor process, such as, for example, 0.5 micrometers, as an illustrative example. The line 1000 is covered by a an overlying insulating dielectric layer, such as can be used to provide scratch protection for the IC die. The overlying insulating dielectric layer can be reduced in profile, if needed, to accommodate RIE via-definition therethrough, or an IC die without final passivation can be used, if desired. In this example, the line 1000 extends longitudinally in an X-dimension on the IC die.

To retrofit a connection to the existing on-IC line 1000, such as for interconnecting the IC to another IC, or for making a jumper between lines on a single IC, a plurality of vias 1004 can be formed through the overlying dielectric, such as by using reactive ion etching (RIE) using the underlying metal line as an etch-stop. In the illustrative example in which the linewidth 1002 is 0.5 micrometers, the vias 1004 can be 0.16 micrometers by 0.16 micrometers. The vias 1004 can be filled, such as by depositing a metal and then planarizing to remove such deposited metal from the regions on the dielectric between the vias 1004. In certain examples, the formation of vias 1004 can be performed as a semiconductor processing step by the manufacturer of the IC die upon which the line 1000 resides.

Then, as described above, the Avatrel® or insulator can be spun-on or otherwise formed, such as to form a monolithic insulator that extends across multiple IC die, in certain examples. A via 1006 can be photolithographically created (such as described above) or otherwise created in the monolithic insulator. A metal line can be formed in the via 1006 and extending elsewhere, as desired, such as to interconnect the minimum linewidth line 1000 to another location on the same IC die, or to a location on another IC die in an assembly of IC die, such as described above.

Since the assembly of IC die can be formed using a mechanical pick-and-place process, as described above, the via 1006 in the monolithic insulator can be sized to accommodate registration misalignment due to the mechanical pick-and-place process, as well as to provide the desired via size. For example, if the underlying line 1000 extends in the X-dimension, then the via 1006 can be formed to have a via dimension 1008 in the orthogonal direction (e.g., the Y-dimension) that accommodates a pick-and-place tolerance, plus the desired minimum via size to provide a desired orthogonal overlap of the line 1000. As an illustrative example, if the pick-and-place tolerance is +/−25 micrometers, and the desired minimum via size to provide the desired orthogonal overlap of the line 1000 is 8 micrometers, then the via dimension 1008 can be 25 micrometers+25 micrometers+8 micrometers=58 micrometers.

If the underlying line extends in the Y-dimension, then the structure shown in FIG. 11 can be rotated by 90 degrees, and the via dimension 1008 can be sized to accommodate pick-and-place tolerance in such direction.

Some Further Examples, Variations, and Improvements:

In the example of FIG. 5A, instead of forming vias 216, similarly-sized connections to the underlying I/O structures 406 can instead be made using a separate overlying integrated circuit die, such as on which bumped or raised connections can be provided (e.g., instead of the vias 216) to electrically connect to the I/O structures 406, which can also be bumped or raised. This can provide for repairable or reconfigurable connection to the I/O structures 406.

Figure 12:
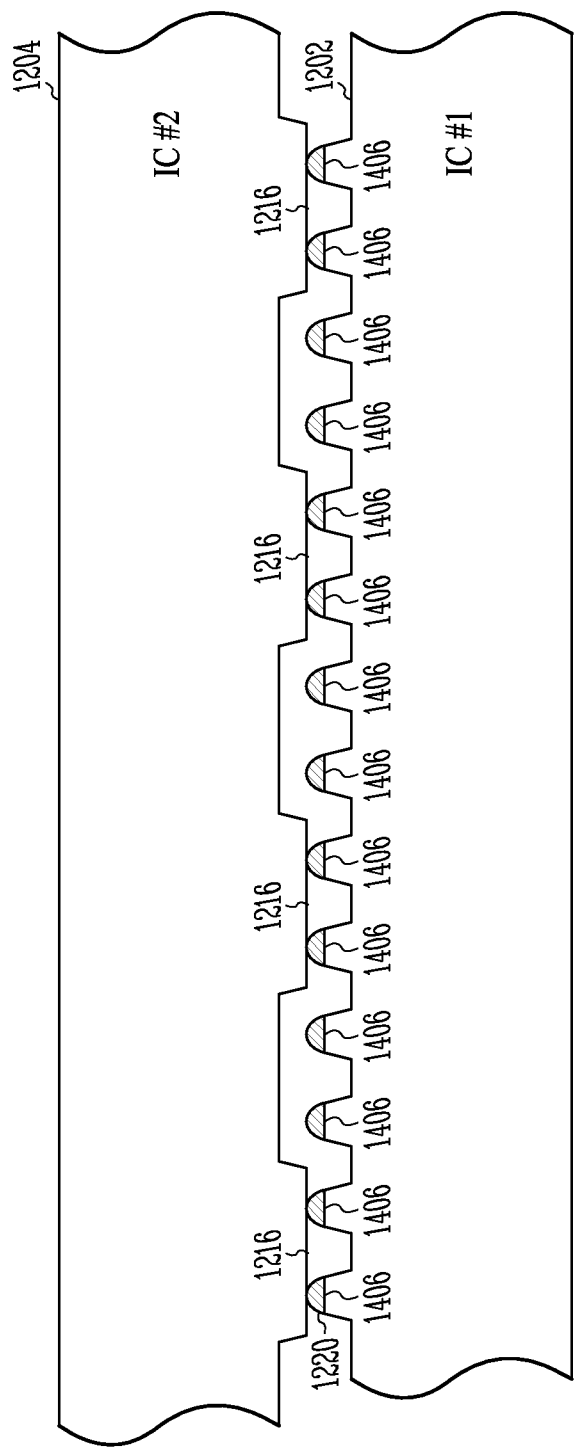
FIG. 12 shows an example of a first and second integrated circuit die that can include opposing working surfaces that can respectively include a plurality of bumped or raised connection structures.

FIG. 12 shows an example of a first integrated circuit die 1202 that can include a working surface that can include a plurality of bumped or raised I/O structures 1406, such as corresponding to the locations of the I/O structures 406 described above with respect to FIG. 5A. A second integrated circuit die 1204 can include a facing working surface including a plurality of structures for providing bumped or raised connections 1216. The bumped or raised connections 1216 on the second integrated circuit die 1204 can correspond to the locations of the vias 216, such as described above with respect to FIG. 5A. Electrical contact can be made between the bumped or raised connections 1216 and the adjacent facing bumped or raised I/O structures 1406, such as by thermal bonding, e.g., using tin regions 1220 that can be located on the bumped or raised I/O structures 1406. In this way, the bumped or raised connections 1216 can serve a similar purpose to the vias 216 of FIG. 5A, which can permit the second integrated circuit die 1204 to serve as an interconnect die that can be bonded to the first integrated circuit die 1202. The second integrated circuit die 1204 can provide programmability to address any misalignment, such as described in detail above with respect to the other examples. In case of connectivity failure between the first integrated circuit die 1202 and the second integrated circuit die 1204, or any other need for reconfiguration, the second integrated circuit die 1204 can be de-bonded from the first integrated circuit die 1202, and optionally replaced, re-aligned, or otherwise re-adjusted, and re-bonded to the first integrated circuit die 1202 as desired. This can provide repairability or reconfigurability, if so desired.

Figure 13:
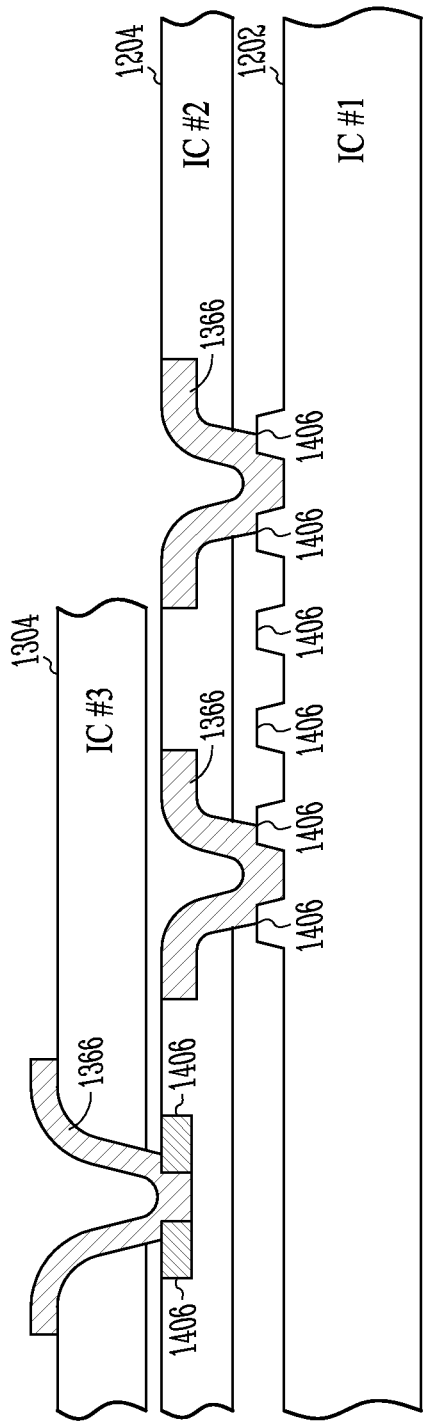
FIG. 13 shows an example of a first integrated circuit die that can include a working surface that can include a plurality of bumped or raised I/O structures, and a second integrated circuit die that can include through-substrate via (TSV) structures.

FIG. 13 shows an example of a first integrated circuit die 1202 that can include a working surface that can include a plurality of bumped or raised I/O structures 1406, such as corresponding to the locations of the I/O structures 406 described above with respect to FIG. 5A. A second integrated circuit die 1204 can include a facing working surface including a plurality of through-substrate via (TSV) structures for providing connections 1316. The via connections 1316 on the second integrated circuit die 1204 can correspond to the locations of the vias 216, such as described above with respect to FIG. 5A. The TSV structures can include a second metal (M2) layer extending from the working surface of the second integrated circuit die 1204 to its backside (an underlying first metal (M1) layer on the backside can also be provided, separated by an inter-metal insulator from the M2, and selectively coupled thereto through vias in the inter-metal insulator). The backside of the second integrated circuit die 1204 can include a plurality of bumped or raised I/O structures 1406, such as corresponding to the locations of the I/O structures 406 described above with respect to FIG. 5A. A third integrated circuit die 1304 can include a facing working surface including a plurality of through silicon via (TSV) structures for providing connections 1366. The via connections 1366 on the third integrated circuit die 1304 can correspond to the locations of the vias 216, such as described above with respect to FIG. 5A. Instead of a third integrated circuit die 1304 with TSV structures, an integrated circuit die similar to the second integrated circuit die 1204 shown in FIG. 12 can be used. Using various combinations of the techniques or arrangements shown in FIGS. 12-13, vertical IC die stacking can be used, such as in combination with horizontal IC die placement, to achieve a high degree of interconnectability between various IC die as desired.

Other Notes:

The above description is intended to be illustrative, and not restrictive. For example, the above-described embodiments (or one or more aspects thereof) may be used in combination with each other. Also, although the above description has emphasized that it may be advantageous to photolithographically define the vias in the monolithic first insulator over the first and second integrated circuit die, and that RIE is not needed, RIE can be used, if desired. If it is desired to perform such RIE through the monolithic first insulator over a region that extends beyond an underlying metal pad, for example, an aluminum nitride or other barrier metal can be used as an etch stop, to stop etching in the region that extends outside of the underlying metal pad or region. Also, although FIG. 4 illustrates 80 µm by 80 µm metal bonding pads, current state of the art technology can provide smaller bonding pads, such as 40 µm by 40 µm bonding pads, for example, and further downward scaling is possible. Also, although the above description has emphasized an example in which vias are formed by photo-developing the Avatrel®, in another example, a monolithic layer of Avatrel® is formed and cured, then a layer of photoresist is formed thereupon, such as by spinning-on, and the photoresist is photo-developed to define via regions, and RIE is used through such a photoresist mask to then create the vias in the Avatrel®. Other variations are also possible.

Other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72(b), which requires that it allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is:

1. An apparatus comprising:
    a first integrated circuit, comprising a two-dimensional first I/O arrangement of conductive first input/output structures of like respective areas, A, on the first integrated circuit that are configured to respectively carry distinct signals;
    an interconnection structure, overlaying or underlaying the two-dimensional first I/O arrangement, the interconnection structure comprising a two-dimensional second I/O arrangement of conductive second input/output structures of respective areas, B, that are configured to respectively carry distinct signals, wherein the area B is larger than the area A; and
    wherein the first integrated circuit is programmable to select which of the plurality of conductive input/output structures underlying or overlying one of the second input/output structures of the interconnection structure electrically conductively communicates using that one of the second input/output structures.

2. The apparatus of claim 1, comprising a second integrated circuit including at least a portion stacked against the first integrated circuit, wherein the second integrated circuit includes the second input/output structures.

3. The apparatus of claim 2, wherein the interconnection structure comprises a first insulator between the first and second integrated circuit die, and wherein the second input/output structures comprise first vias extending through the first insulator layer.

4. The apparatus of claim 1, wherein the second input/output structures comprise bumps on a second integrated circuit overlaying or underlaying the first integrated circuit.

5. The apparatus of claim 1, wherein the second input/output structures comprise vias in a first insulator overlaying or underlaying the first input/output structures.

6. The apparatus of claim 1, wherein:
    the first I/O arrangement comprises a two-dimensional first I/O array of the conductive first input/output structures, the two dimensional first I/O array defining a first area; and
    the second I/O arrangement comprises a two-dimensional second I/O array of the conductive second input/output structures, the two dimensional second I/O array defining a second area, wherein the first area is larger than the second area.

7. The apparatus of claim 6, wherein the first area is larger than the second area by an amount that accommodates an error tolerance of an integrated circuit die pick-and-place apparatus, such that the second area is capable of being overlaid or underlaid within the first area when the first integrated circuit is placed into position using the pick-and-place apparatus.

8. The apparatus of claim 6, comprising:
    a first two-dimensional alignment array of addressable contacts;
    a first alignment structure in the interconnection structure, the first alignment structure sized for connecting to a single one of the addressable contacts in the first two-dimensional alignment array; and
    an alignment detection circuit, configured to address the contacts in the first two-dimensional alignment array to determine alignment information based upon determining which of the contacts in the first two-dimensional alignment array is aligned to and electrically connected with the first alignment structure.

9. The apparatus of claim 8, wherein the programming circuit is coupled to the alignment detection circuit and configured to use alignment information from the alignment detection circuit to select which of the plurality of conductive first input/output structures under the second input/output structure electrically conductively communicates using the second input/output structure.

10. The apparatus of claim 8, comprising:
    a second two-dimensional alignment array of addressable contacts;
    a second alignment structure, the second alignment structure sized for connecting to a single one of the addressable contacts in the second two-dimensional alignment array; and
    wherein the alignment detection circuit is also configured address the contacts in the second two-dimensional alignment array to determine the alignment information based upon determining which of the contacts in the second two-dimensional alignment array is aligned to and electrically connected with the second alignment structure.

11. The apparatus of claim 10, wherein the first and second two-dimensional alignment arrays are located on the first integrated circuit with a plurality of the conductive input/output structures on the first integrated circuit located between the first and second two-dimensional alignment arrays.

12. The apparatus of claim 1, wherein the plurality of conductive first input/output structures on the first integrated circuit includes a plurality of bumped or raised I/O structures.

13. The apparatus of claim 12, wherein the second input/output structures respectively include a bumped or raised electrical connection that are respectively electrically coupled to the bumped or raised electrical connections of the first input/output structures.

14. The apparatus of claim 13, wherein the plurality of conductive first input/output structures on the first integrated circuit includes a plurality of bumped or raised I/O structures that are removably thermally bonded to the bumped or raised electrical connection of the second input/output structures.

15. An apparatus comprising:
a first integrated circuit die, comprising a two-dimensional first I/O arrangement of conductive first input/output structures of like respective areas, A, on the first integrated circuit that are configured to respectively carry distinct signals;
an interconnection structure, overlaying or underlaying the two-dimensional first I/O arrangement, the interconnection structure comprising a two-dimensional second I/O arrangement of conductive second input/output structures of respective areas, B, that are configured to respectively carry distinct signals, wherein the area B is larger than the area A;
wherein the first integrated circuit is programmable to select which of the plurality of conductive input/output structures underlying or overlying one of the second input/output structures of the interconnection structure electrically conductively communicates using that one of the second input/output structures; and
a second integrated circuit die, vertically stacked against the first integrated circuit die, wherein the interconnection structure provides electrical communication of a plurality of distinct electrical signals between the vertically stacked first and second integrated circuit die.

16. The apparatus of claim 15, wherein the second input/output structures comprises only one of:
bumps on a second integrated circuit overlaying or underlaying the first integrated circuit; or
vias in a first insulator overlaying or underlaying the first input/output structures.

17. The apparatus of claim 16, wherein:
the first I/O arrangement comprises a two-dimensional first I/O array of the conductive first input/output structures, the two dimensional first I/O array defining a first area; and
the second I/O arrangement comprises a two-dimensional second I/O array of the conductive second input/output structures, the two dimensional second I/O array defining a second area, wherein the first area is larger than the second area.

18. An apparatus comprising:
a first integrated circuit die, comprising a two-dimensional first I/O arrangement of conductive first input/output structures of like respective areas, A, on the first integrated circuit that are configured to respectively carry distinct signals;
an interconnection structure, overlaying or underlaying the two-dimensional first I/O arrangement, the interconnection structure comprising a two-dimensional second I/O arrangement of conductive second input/output structures of respective areas, B, that are configured to respectively carry distinct signals, wherein the area B is larger than the area A;
wherein the first integrated circuit is programmable to select which of the plurality of conductive input/output structures underlying one of the second input/output structures of the interconnection structure electrically conductively communicates using that one of the second input/output structures; and
wherein:
the first I/O arrangement comprises a two-dimensional first I/O array of the conductive first input/output structures, the two dimensional first I/O array defining a first area; and
the second I/O arrangement comprises a two-dimensional second I/O array of the conductive second input/output structures, the two dimensional second I/O array defining a second area, wherein the first area is larger than the second area.

19. The apparatus of claim 18, comprising a second integrated circuit, vertically attached to the first integrated circuit die, wherein the interconnection structure provides electrical communication of a plurality of distinct electrical signals between the first and second vertically attached integrated circuit die.

20. The apparatus of claim 18, wherein the second input/output structures comprises only one of:
bumps on a second integrated circuit overlaying or underlaying the first integrated circuit; or
vias in a first insulator overlaying the first input/output structures.

* * * * *